(12) United States Patent
Shibayama et al.

(10) Patent No.: US 6,853,177 B2
(45) Date of Patent: Feb. 8, 2005

(54) SEMICONDUCTOR DEVICE WITH PROCESS MONITOR CIRCUIT AND TEST METHOD THEREOF

(75) Inventors: Mari Shibayama, Tokyo (JP); Yoshinori Fujiwara, Tokyo (JP); Yoshihiro Nagura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 16 days.

(21) Appl. No.: 10/108,265

(22) Filed: Mar. 28, 2002

(65) Prior Publication Data

US 2002/0153525 A1 Oct. 24, 2002

(30) Foreign Application Priority Data

Mar. 29, 2001 (JP) .................................... P2001-095218
Jan. 8, 2002 (JP) .................................... P2002-001316

(51) Int. Cl.[7] ........................... G01R 31/26; G06F 11/27
(52) U.S. Cl. .................. 324/76.48; 324/763; 324/765; 714/30
(58) Field of Search ............................... 324/765, 537, 324/158.1, 759, 763; 714/30, 733, 734, 55

(56) References Cited

U.S. PATENT DOCUMENTS

| 4,038,648 A | * | 7/1977 | Chesley | 365/201 |
|---|---|---|---|---|
| 4,762,663 A | * | 8/1988 | Cook et al. | 376/259 |
| 4,796,211 A | * | 1/1989 | Yokouchi et al. | 714/55 |
| 5,818,250 A | * | 10/1998 | Yeung et al. | 324/763 |
| 5,867,033 A | * | 2/1999 | Sporck et al. | 324/763 |
| 6,263,463 B1 | * | 7/2001 | Hashimoto | 714/724 |
| 6,556,021 B1 | * | 4/2003 | Nguyen et al. | 324/537 |
| 6,738,934 B2 | * | 5/2004 | Frank et al. | 714/51 |

FOREIGN PATENT DOCUMENTS

| JP | 9-127186 | 5/1997 |
|---|---|---|
| JP | 2000-12639 | 1/2000 |

* cited by examiner

Primary Examiner—Anjan K. Deb
(74) Attorney, Agent, or Firm—McDermott Will & Emery LLP

(57) ABSTRACT

The invention provides a semiconductor device capable of appropriately debugging any fluctuation in element characteristic even when the element characteristic fluctuates exceeding a value estimated at the designing stage. This semiconductor device includes a process monitor circuit that monitors any fluctuation in process and outputs a monitor signal M representing a result of monitoring, in addition to circuit blocks that perform respectively required functions. And a timing control circuit that controls timing of an input signal inputted to a predetermined circuit element forming the circuit blocks based on the monitor signal M from the process monitor circuit is provided in the circuit blocks.

17 Claims, 27 Drawing Sheets

OSCILLATION CIRCUIT 4a

FIG.4
(a) 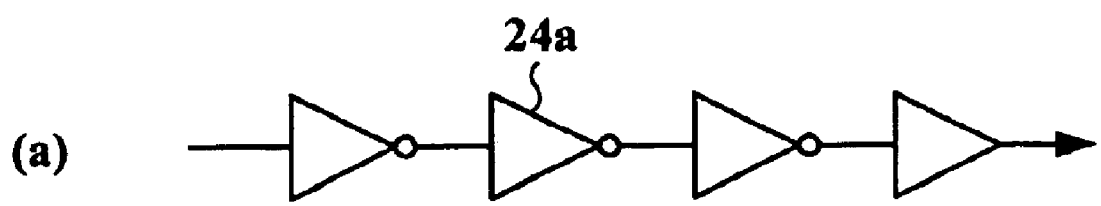
(b) 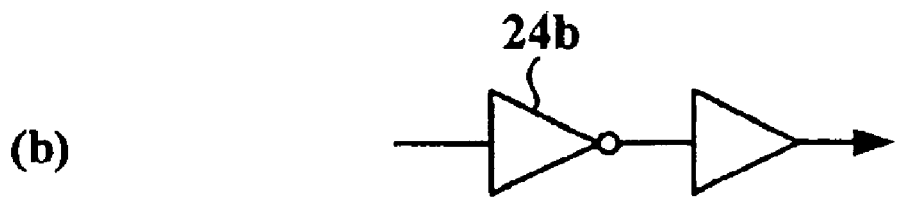

SEMICONDUCTOR DEVICE WITH PROCESS MONITOR CIRCUIT AND TEST METHOD THEREOF

BACKGROUND OF THE INVENTION

1. Technical Field

The present invention relates to a semiconductor device provided with a process monitor circuit in order to monitor fluctuation in circuit element characteristic due to any process change or variation and debug a result thereof, and a test method thereof.

2. Background Art

Generally, in manufacturing process of a semiconductor device, any fluctuation in characteristic is generated in any circuit element such as transistor that is an essential element of the semiconductor device or a logic gate formed in combination of the transistors due to variation in process conditions.

To overcome this, design is usually carried out taking such a fluctuation in characteristic of the circuit element due to variation in process into account (the fluctuation is hereinafter referred to as "fluctuation in process" or "process fluctuation"). However, in the case of any large variation in process conditions, there is a possibility that the characteristic of the circuit element fluctuates exceeding a value estimated preliminarily at the stage of designing. In such a case, with no way for any debug, there has been no alternative but to scrap it as a defective item.

Moreover, since it is necessary to consider the fluctuation in element characteristic due to the process variation whenever designing the semiconductor device, restriction such as timing control to secure an operation margin of the circuit element becomes large resulting in a restriction on the freedom in design.

In one of the prior arts, to monitor the fluctuation in element characteristic due to the process variation caused at the time of manufacturing a semiconductor device, a technique was proposed. In this technique, a test evaluation gate (TEG) is mounted on the same chip together with various circuit blocks performing required functions such that so-called built-in-test can be implemented. (For example, see the Japanese Patent Publications (unexamined) No. 12639/2000, the Japanese Patent Publications (unexamined) No. 127186/1997, etc.)

However, the mentioned conventional technique only makes it possible to monitor what level of fluctuation in element characteristic of the semiconductor device is generated due to the variation in process conditions, and never makes it possible to automatically debug the semiconductor device itself in which the fluctuation in process actually occurs.

That is, a result of monitor evaluated by means of the test evaluation gate is outputted to outside to early discover any defect, which is nothing but a suggestion for improvement in the process conditions of the semiconductor device. En effect, once fluctuation in process is generated, it is impossible to debug the element characteristic of the semiconductor device, individually for each element.

Therefore, when any element characteristic fluctuates exceeding a value estimated at the designing stage, there has been no choice but scrapping the semiconductor device as a defective item. Moreover, since it is necessary to consider the fluctuation in element characteristic due to the process variation whenever designing the semiconductor device, a large restriction on the operation timing becomes large. Consequently a problem exists in that freedom in the design is still limited.

In addition, several improvements in practical use such as in control method were proposed in the process monitor circuit for monitoring the fluctuation in element characteristic due to process variation disclosed in the foregoing prior arts. (See the Japanese Patent Publication (unexamined) No. 12639/2000, the Japanese Patent Publication (unexamined) No. 127186/1997, etc.) That is, in order to apply such known circuit to the semiconductor device, it is required to increase number of terminals, and because control of the process monitor circuit is not always simple, a further problem exits in that manufacturing cost of the semiconductor device is raised.

SUMMARY OF THE INVENTION

The present invention has been made to solve the above-described problems, and has an object of providing a semiconductor device capable of appropriately debugging any fluctuation even in the case that any element characteristic fluctuates exceeding a value estimated at the designing stage, thus preventing operation margin of any circuit element from being reduced due to fluctuation in process, improving freedom in design, and reducing production of defective product.

Another object of the invention is to apply a simple control method to a process monitor circuit itself that monitors the fluctuation in element characteristic due to the process variation thereby making it possible to put the process monitor circuit into practical use.

To achieve the foregoing objects, a semiconductor device of the invention includes:

a process monitor circuit that monitors fluctuation in process and outputs a monitor signal representing a result of monitoring, in addition to a plurality of circuit blocks performing required functions respectively; and a timing control circuit that controls timing of an input signal with respect to a predetermined circuit element constituting the mentioned circuit blocks, based on the mentioned monitor signal from the mentioned process monitor circuit.

As a result of employing such arrangement, in the manufacturing process of the semiconductor device, even when any characteristic of the circuit element fluctuates exceeding a value estimated at the designing stage, operation timing of the circuit element affected by the fluctuation in process can be appropriately controlled. Accordingly, it becomes possible to prevent operation margin of the circuit element from being reduced thereby improving a degree of freedom in designing.

And a semiconductor device of the invention includes a process monitor circuit that monitors fluctuation in process and outputs a result of monitoring to outside, the mentioned process monitor circuit being included of:

an oscillation circuit that oscillates at a predetermined frequency; a frequency counter that measures oscillation frequency of the mentioned oscillation circuit; and a control section that controls operation of the mentioned process monitor circuit based on an external control signal; wherein a counting value of the mentioned frequency counter is outputted to outside.

As a result, without any special and dedicated external device, fluctuation in the manufacturing process of the semiconductor device can be monitored using a simple general-purpose semiconductor test apparatus. In particular, simple control on a command base by means of the control section becomes possible, and the measurement will be simple. Further, development time and development cost of any program, etc. for the purpose of measurement is reduced. In addition, a large number of control terminals are not required, thereby any expensive overhead charge on the product applied with the semiconductor device is not required.

A test method of the invention is a test method of a semiconductor device provided with a process monitor circuit that monitors fluctuation in process and outputs a result of monitoring to outside;

the said process monitor circuit comprising: an oscillation circuit that oscillates at a predetermined frequency; a frequency counter that measures oscillation frequency of said oscillation circuit; and a control section that controls operation of said process monitor circuit based on an external control signal; thus outputting a count value of said frequency counter to outside;

the test method comprising a step of monitoring the counting value outputted from said frequency counter.

As a result, in the test method of the invention, without any special and dedicated external device, a delay time of psec order can be measured in a short time as well as at a high accuracy using a simple and general-purpose semiconductor test apparatus.

BRIEF DESCRIPTION OF THE DRAWINGS

FIG. 4 is a circuit diagram of a delay circuit used in the timing control circuit of FIG. 3.

DESCRIPTION OF THE PREFERRED EMBODIMENTS

Embodiment 1

Figure 1:
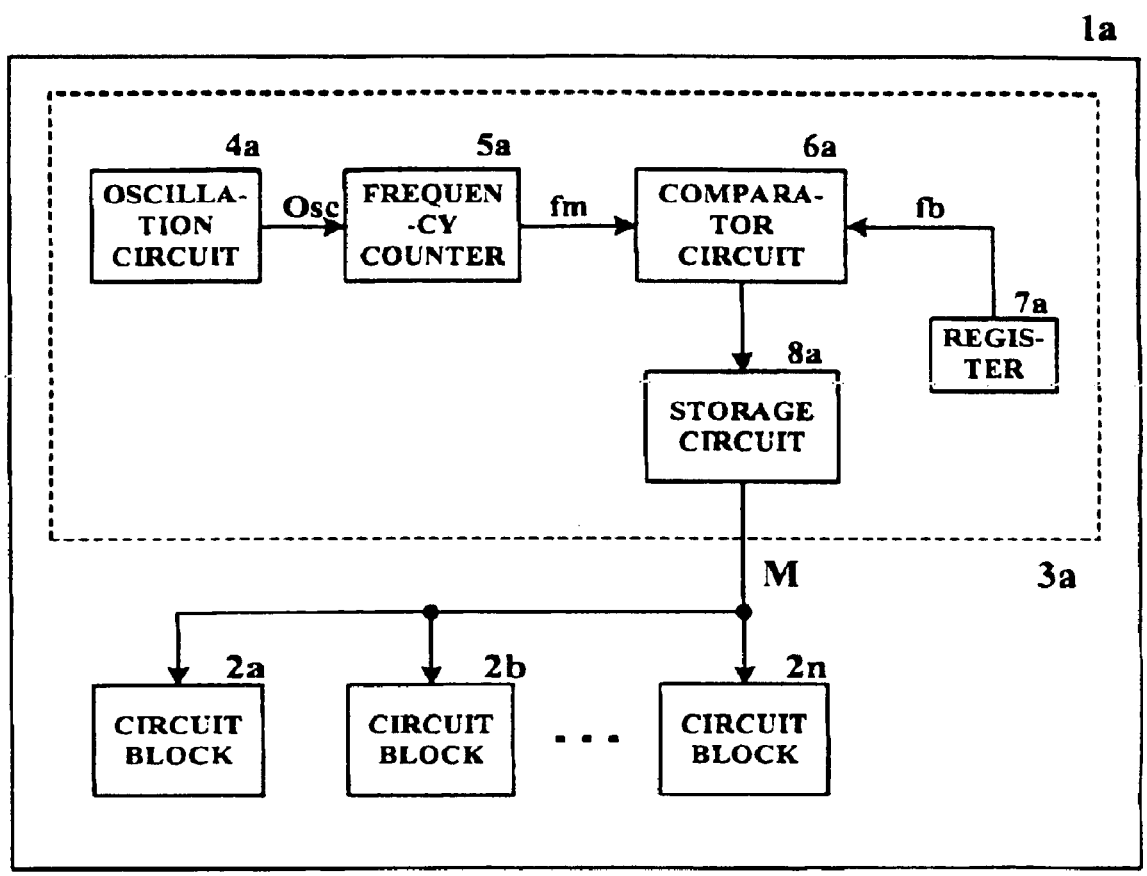
FIG. 1 is a block diagram showing an arrangement of a semiconductor device according to Embodiment 1 of the present invention.
Figure 2:
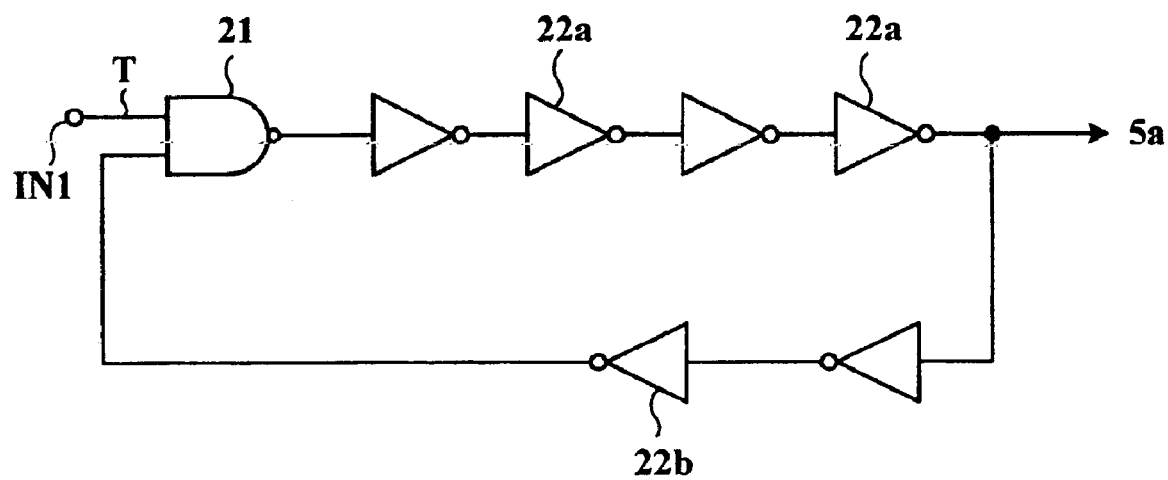
FIG. 2 is a circuit diagram showing a detailed arrangement of a ring oscillator used in a process monitor circuit of the semiconductor device according to Embodiment 1 of the invention.

FIG. 1 is a block diagram showing an arrangement of a semiconductor device according to Embodiment 1 of the present invention.

In this semiconductor device according to Embodiment 1, on the same semiconductor chip 1a, a plurality of circuit blocks 2a to 2n that individually perform required functions are provided. In addition to these circuit blocks 2a to 2n, a process monitor circuit 3a that monitors fluctuation in process and outputs a monitor signal M indicating a result thereof (1 bit of data in this example), is also mounted thereon.

Taking a case of DRAM as an example, equivalent to the above-described respective circuit blocks 2a to 2n are timing signal generation circuit for writing or reading out, address signal generation circuit, refresh signal generation circuit and the like.

Further, the process monitor circuit 3a is provided with an oscillation circuit 4a that oscillates at a predetermined frequency, a frequency counter 5a that measures an oscillation frequency Osc of the oscillation circuit 4a, a comparator circuit 6a that compares an oscillation frequency fm measured by means of the frequency counter 5a with a preliminarily set reference value fb, a register 7a in which the above-described reference value fb is preliminarily registered, and a storage circuit 8a that stores the result of comparison in the comparator circuit 6a. As the storage circuit 8a, a latch circuit such as memory, flip flop, etc. is applied.

The above-described oscillation circuit 4a is provided with a NAND gate 21 of two inputs, inverters 22a on the oscillation output side that are cascade-connected to an output part of the NAND gate 21 and inverters 22b on the feedback side that feeds back a part of the oscillation output to one of the input terminals of the NAND gate 21. Thus a ring oscillator is arranged with these elements connected in order forming a ring. Furthermore, a signal T for executing a start/stop of the oscillation is inputted from outside to the other input terminal IN1 of the NAND gate 21. In addition, as for number of stages of the above-described inverters, it is essential that total number of stages of the inverters 22a and inverters 22b be even. It is further essential that oscillation period of a path of the NAND gate 21, the inverter 22a and the inverter 22 is suitable for the frequency counter 5a.

Figure 3:
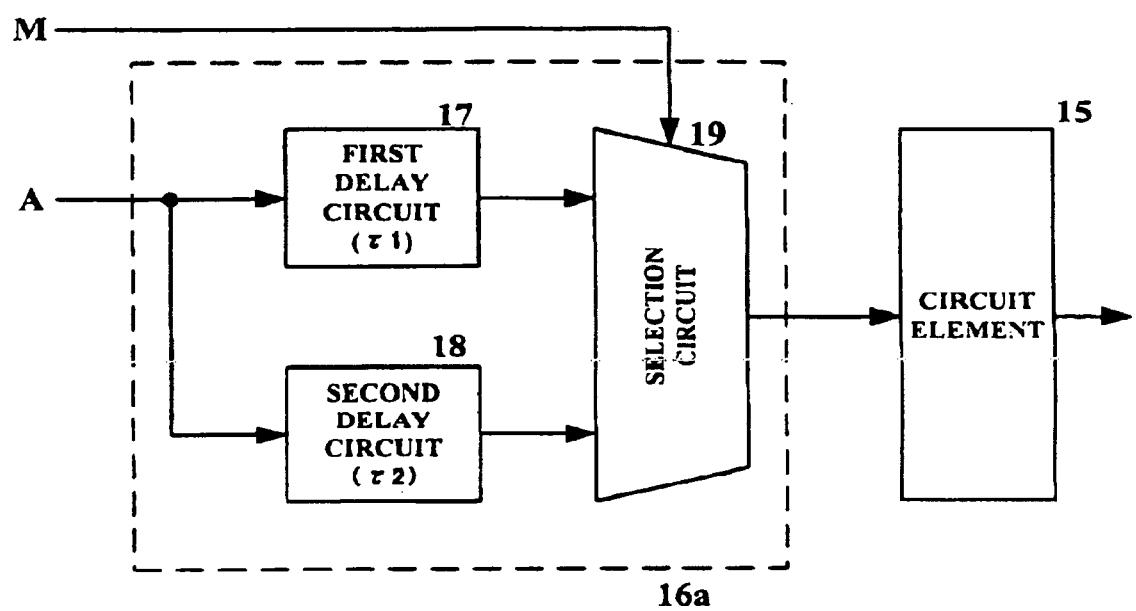
FIG. 3 is a block diagram showing a timing control circuit and a circuit element provided within a circuit block of the semiconductor device according to Embodiment 1 of the invention.

On the other hand, each of the circuit blocks 2a to 2n is formed containing various circuit elements such as logic gate in which transistors are basic elements. Among those circuit elements, a predetermined circuit element 15 required for securing an appropriate operation timing is provided with a timing control circuit 16a that controls timing of an input signal A inputted to the mentioned circuit element 15 based on a monitor signal M from the process monitor circuit 3a, as shown in FIG. 3.

This timing control circuit 16a is constituted of signal delay means for giving a delay amount in response to the monitor signal M to the input signal A inputted to the circuit element 15. That is, the signal delay means employed in this first embodiment is of a type to switch number of stages of gate. This signal delay means is provided with a first and second delay circuits 17, 18 that give mutually different delay amounts $\tau 1$, $\tau 2$ to the input signal A inputted to the circuit element 15, and a selection circuit 19 that selects either one of the signal outputs having passed through each delay circuit 17 or 18 based on the monitor signal M outputted from the process monitor circuit 3a.

Delay amount $\tau 1$, $\tau 2$ given by each delay circuit 17 or 18 to the input signal A is separately set respectively in accordance with element characteristic of the circuit element 15. In case of an example shown in FIG. 4, the first delay circuit 17 is constituted of four stages of inverters 24a that are cascaded-connected. Furthermore, the second delay circuit 18 is constituted of two stages of inverters 24b that are cascaded-connected. Accordingly, in this example, the delay amount $\tau 1$ at the first delay circuit 17 is greater than the delay amount $\tau 2$ at the second delay circuit 17 ($\tau 1 > \tau 2$). In addition, it is possible that the delay amount $\tau 2$ at the second delay circuit 18 may be set to zero as the case may be.

Now, in the semiconductor device of the above-described arrangement, when the fluctuation in process is generated in the circuit element thereof, operation for appropriately correcting this circuit element based on the result of monitoring the process monitor circuit 3a is hereinafter described.

First, a signal T for starting the oscillation (herein a "H" level of signal) is inputted from outside to the input terminal IN1 that is one of the input terminals of the NAND gate 21 forming the oscillation circuit 4a of the process monitor circuit 3a. Thus, the oscillation circuit 4a starts the oscillation, and the oscillation frequency thereof varies depending on characteristic of the circuit element forming the oscillation circuit 4a (particularly transistors serving as essential circuit element). This means a reflection of the characteristic of the circuit element forming each of the circuit blocks 2a to 2n built in simultaneously with the process monitor circuit 3a.

The oscillation frequency of the oscillation circuit 4a is measured at the frequency counter 5a of a subsequent stage. Then, data of the measured oscillation frequency fm is outputted to the comparator circuit 6a. The comparator circuit 6a compares the oscillation frequency fm of the oscillation circuit 4a measured at the frequency counter 5a with the reference value fb that is estimated preliminarily at the time of designing and registered in the register 7a. Therefore, it becomes possible to presume a level of characteristic of the circuit element such as inverter constituted of the transistors serving as essential circuit element of the semiconductor device.

The comparator circuit 6a outputs, for example, a signal of "H" level as the monitor signal M in the case that the oscillation frequency fm of the oscillation circuit 4a is higher than the reference value fb. On the other hand, the comparator circuit 6a outputs, for example, a signal of "L" level as the monitor signal M in the case that the oscillation frequency fm of the oscillation circuit 4a is not higher than the reference value fb. Then, this monitor signal M is once stored in the storage circuit 8a, and thereafter outputted to each of the circuit block 2a to 2n.

With respect to a predetermined circuit element 15 disposed in each of the circuit block 2a to 2n, a timing control circuit 16a is provided at the preceding stage, as shown in FIG. 3. Therefore, this timing control circuit 16a controls so that the input signal A inputted to the mentioned circuit element 15 may be appropriate in terms of timing based on the monitor signal M from the process monitor circuit 3a.

More specifically, in the case that the monitor signal M is of the mentioned "H" level, the selection circuit 19 selects the output signal of the first delay circuit 17 of which delay amount $\tau 1$ is large. On the contrary, in the case the monitor signal M is of the mentioned "L" level, the selection circuit 19 selects the output signal of the second delay circuit 18 of which delay amount $\tau 2$ is small. Accordingly, the circuit element 15 is controlled so as to be in an optimum operation timing at all times, thereby an operation margin being improved. In this manner, the operation margin of the circuit element is prevented from being reduced due to the fluctuation in process, thereby improving freedom in design.

Further, after completing the tuning as described above, a device test is conducted. When the result of test is finally good, the monitor signal M stored in the storage circuit 8a is held on a permanent basis, resulting in debug of the fluctuation in process of the semiconductor device. Consequently generation of defective product is restrained and a yield rate is improved.

In addition, in the above-describe embodiment, it is arranged such that the monitor signal M is once stored in the storage circuit 8a, and thereafter outputted to each of the circuit blocks 2a to 2n. However, it is also preferable that the storage circuit 8a may be omitted, and the monitor signal M may be outputted directly to each of the circuit blocks 2a to 2n.

Embodiment 2

Figure 5:
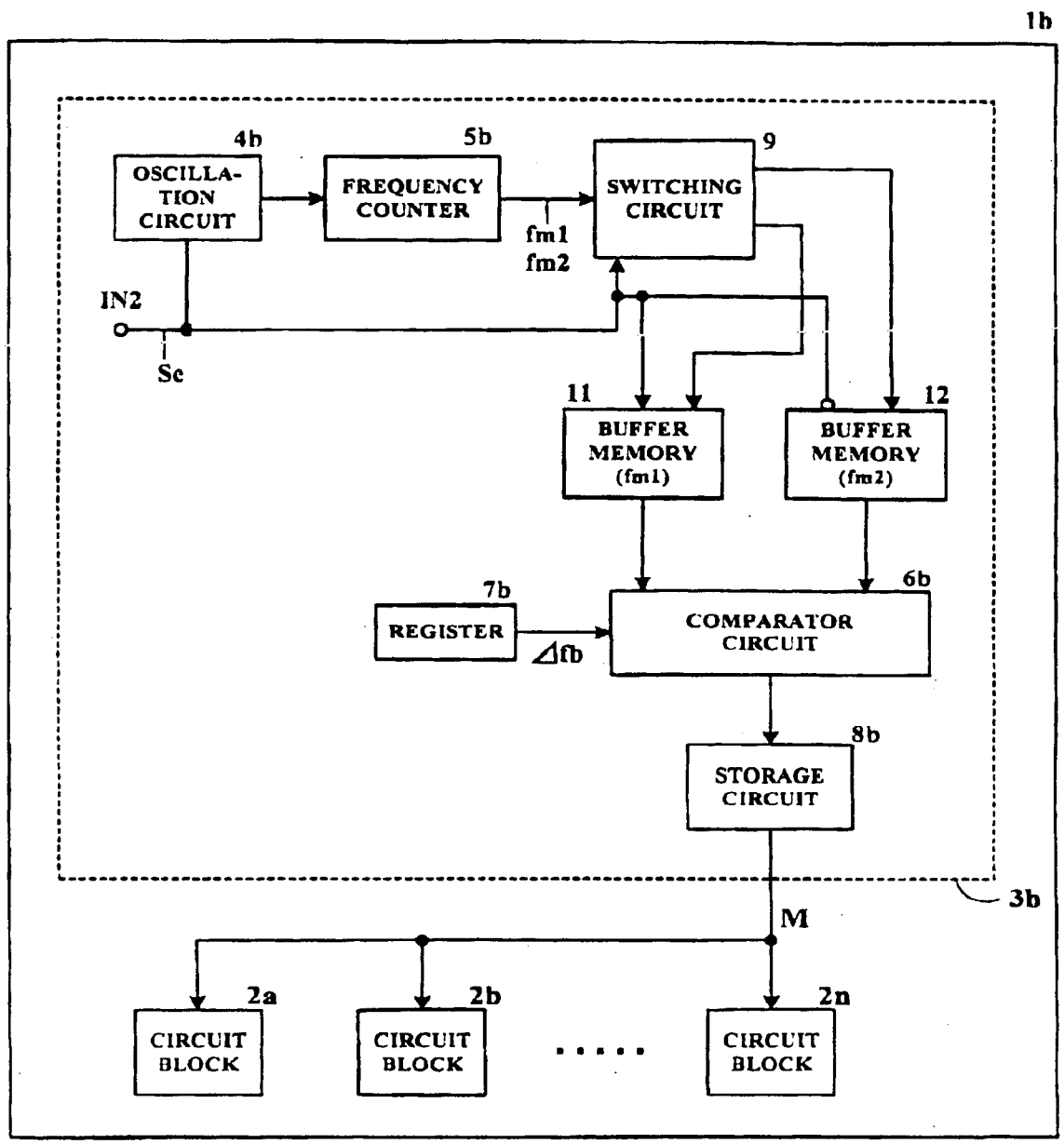
FIG. 5 is a block diagram showing an arrangement of the semiconductor device according to Embodiment 2 of the invention.

FIG. 5 is a block diagram showing an arrangement of the semiconductor device provided with a process monitor circuit according to Embodiment 2 of the invention.

In the semiconductor device according to this second embodiment, in order to improve accuracy in monitoring the process fluctuation in element characteristic, the arrangement of the process monitor circuit (FIG. 1) according to the foregoing Embodiment 1 is modified.

That is, in this second embodiment, on the same semiconductor chip 1b, a plurality of circuit blocks 2a to 2n that individually perform required functions are provided. In addition to these circuit blocks 2a to 2n, a process monitor circuit 3b that monitors fluctuation in process is also mounted thereon. Further, this process monitor circuit 3b is provided with an oscillation circuit 4b that oscillates at mutually different frequencies respectively in response to a selection signal Se supplied from outside.

Figure 6:
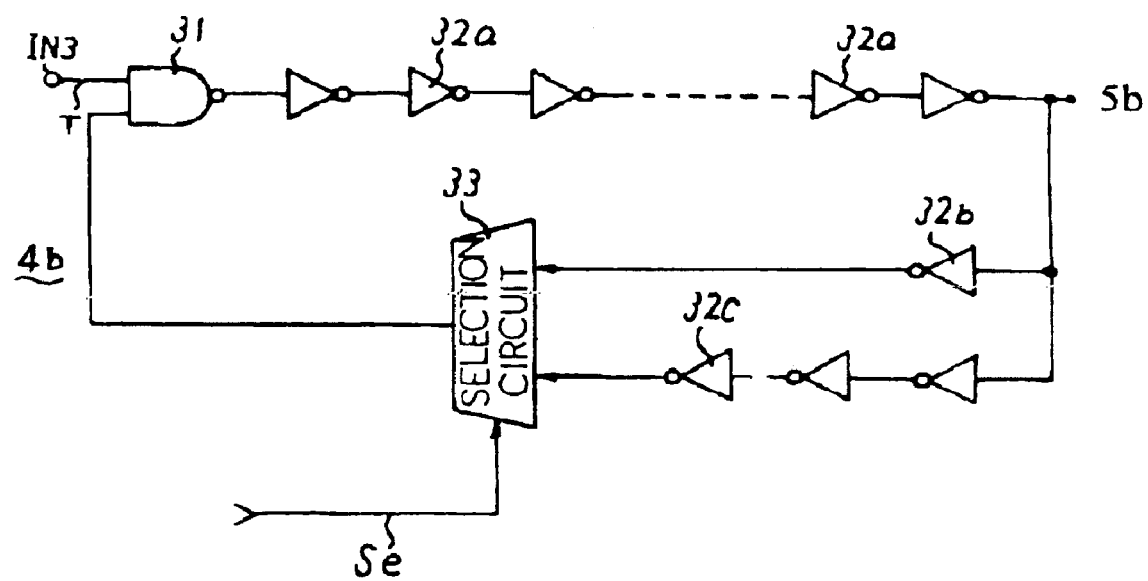
FIG. 6 is a circuit diagram showing a detailed arrangement of the ring oscillator used in the process monitor circuit of the semiconductor device according to Embodiment 2 of the invention.

This oscillation circuit 4b, as shown in FIG. 6, is provided with a NAND gate of two inputs, inverters 32a on the side of oscillation output that are cascade-connected in plural stages to an output part of the NAND gate 31, biserial inverters 32b, 32c on the side of feedback that feeds back a part of the oscillation output from the inverters 32a to one of the input terminals of the NAND gate 31, and a selection circuit 33 that selects either one of outputs from the biserial inverters 32b, 32c on the feedback side. These elements are connected in order forming a ring.

In this arrangement, each of the upper and lower biserial inverters 32b, 32c on the feedback side is set to be different from each other in number of stages of each series. That is, in this second embodiment, among the biserial inverters 32b, 32c on the feedback side, one inverter 32b is provided with one stage, and the other inverter 32c is provided with three stages. Accordingly, a difference in number of stages between the upper and lower series becomes two. Note, however, that the difference in number of these stages is not specifically limited. But the difference in number of stages can be set properly within the range of producing any difference in oscillation frequency enough to be capable of monitoring the process fluctuation in element characteristic.

Furthermore, a signal T that executes start/stop of the oscillation is inputted from outside to the other input terminal IN3 of the NAND gate 31, and additionally a selection signal Se is inputted from outside to the selection circuit 33 respectively.

In addition, this process monitor circuit 3b are provided with the following circuits. They are a frequency counter 5b that measures each of the oscillation frequencies of the mentioned biserial oscillation circuit 4b; a switching circuit 9 that distributes data of the oscillation frequencies fm1, fm2 measured by the frequency counter 5b in response to the selection signal Se; a first and second buffer memories 11, 12 that temporarily stores the data of each of the oscillation frequencies fm1, fm2 distributed by the switching circuit 9; a comparator circuit 6b that calculates a difference between the two oscillation frequencies, $\Delta fm$ (=fm1−fm2) from the data of the frequencies fm1, fm2 stored in each of the buffer memories 11, 12, and comparing the frequency difference $\Delta fm$ with a preliminarily set reference value $\Delta fb$; a register 7b in which the above-described reference value $\Delta fb$ is preliminarily registered; and a storage circuit 8b that stores a result of comparison of the comparator circuit 6b.

In addition, also in this second embodiment, in the same manner as in the foregoing Embodiment 1, a predetermined circuit element 15 of each of the circuit blocks 2a to 2n is provided with a timing control circuit 16a. Arrangement of the timing control circuit 16a in this case is basically the same as shown in FIGS. 3 and 4 and therefore a detailed description thereof will be omitted herein.

Now, when any fluctuation in process is generated in the circuit element of the semiconductor device of this Embodiment 2, monitoring operation conducted by means of this process monitor circuit 3b is hereinafter described.

First, for example, a selection signal Se of "H" level is inputted from an external input terminal IN2, whereby the selection circuit 33 in the oscillation circuit 4b is connected to the inverter 32b being one series on the feedback side. Then, in response to this selection signal Se, the switching circuit 9 is connected to the first buffer memory 11, and further this first buffer memory 11 is brought into a state capable of storing data.

Under such a state, a signal T for starting the oscillation (signal of "H" level in this case) is inputted from the outside to the input terminal IN3, being one of the input terminals of the NAND gate forming the oscillation circuit 4b of the process monitor circuit 3b. Thus, a part of the signal outputs from the inverters 32a on the oscillation output side, is fed back to the NAND gate 31 via the inverter 32b, being one series on the feedback side and the selection circuit 33, whereby the oscillation circuit 4b starts the oscillation. Further, the oscillation frequency thereof is measured by the frequency counter 5b at the subsequent stage, and data of the measured oscillation frequency fm1 is stored in the first buffer memory 11 via the switching circuit 9.

Subsequently, the selection signal Se of, for example, "L" level is inputted from the external input terminal IN2 to connect the selection circuit 33 in the oscillation circuit 4b to the other series of inverters 32c on the feedback side. Then, in response to the selection signal Se, the switching circuit 9 is connected to the second buffer memory 12, and further the second buffer memory 12 is brought into the state capable of storing data.

Under such a state, the signal T for starting the oscillation (signal of "H" level) is inputted from outside to the input terminal IN3, being one of the input terminals of the NAND gate forming the oscillation circuit 4b of the process monitor circuit 3b. Thus, a part of the signal outputs from the inverters 32a on the output side is fed back to the NAND gate 31 via the inverters 32c, being the other series on the feedback side and the selection circuit 33, whereby the oscillation circuit 4b starts the oscillation. Further, the oscillation frequency thereof is measured by the frequency counter 5b at the subsequent stage, and data of the measured oscillation frequency fm2 is stored in the second buffer memory 12 via the switching circuit 9.

It is to be noted that a difference $\Delta fm$ (=fm1−fm2) between the oscillation frequencies fm1 and fm2 stored separately in the first and second buffer memories 11 and 12 is corresponding to the difference in number of stages between the upper and lower biserial inverters 32b, 32c on the feedback side of the oscillation circuit 4b. Accordingly, when preliminarily setting a wire length of each series of inverters 32b, 32c to be minimum, operation speed of each individual inverter can be accurately observed.

Then, the comparator circuit 6b fetches in the data of the oscillation frequencies fm1, fm2 of the ring oscillator 4b stored in the first and second buffer memories 11, 12 to calculate a difference $\Delta fm$ between them. Subsequently, the comparator circuit 6b compares a value of the frequency difference Δfm with a reference value Δfb that is estimated preliminarily at the designing stage and registered in the register 7b. Therefore, it becomes possible to presume a level of characteristic possessed by the inverter comprised of the transistors, being an essential circuit element of the semiconductor device.

Then, in the case that a difference between the oscillation frequencies Δfm is larger than the reference value Δfb, the comparator circuit 6b outputs, for example, a signal of "H" level as the monitor signal M. On the other hand, in the case that the oscillation frequency difference Δfm is not larger than the reference value Δfb, the comparator circuit 6b outputs, for example, a signal of "L" level as the monitor signal M.

Thus, the monitor signal M outputted from the process monitor circuit 3a, in the same manner as in the foregoing Embodiment 1, is once stored in the storage circuit 8b, and thereafter outputted to each of the circuit blocks 2a to 2n. Subsequently, the signal M is controlled by means of the timing control circuit 16a provided in the circuit element 15 so that the input signal A to the predetermined circuit element 15 in each of the circuit blocks 2a to 2n may be appropriate in timing.

In this manner, the semiconductor device according to Embodiment 2 makes it possible to presume a level of characteristic the inverter constituted of the transistor, being an essential circuit element of the semiconductor device, by means of the process monitor circuit 3b. Therefore, the process fluctuation in element characteristic due to the process variation can be monitored more accurately. Consequently, the predetermined circuit element 15 in each of the circuit blocks 2a to 2n becomes controlled so as to perform optimum operation timing at all times, thus operation margin being further improved.

In addition, in the above-described Embodiment 2, the elements on the feedback side forming the oscillation circuit 4b are comprised of the inverters 32b, 32c. However, not being limited to such arrangement, it is also possible to utilize each transistor of MOS type or bipolar type, or any other logic gate such as NAND gate.

Furthermore, in each of the foregoing Embodiments 1 and 2, for reasons of explanation, described is an example in which the first and second delay circuits 17, 18 having mutually different delay amounts τ1, τ2 as the timing control circuit 16a are provided. However, the present invention is not limited to such arrangement. It is also possible that a large number of delay circuits having mutually different delay amounts are provided in parallel, so that appropriate delay amounts τ1, τ2, τ3, τ4, . . . may be selected in order to secure an operation margin of the circuit element 15. In such an arrangement, it is required that the monitor signal M outputted from the process monitor circuits 3a, 3b is outputted as data having number of bits corresponding to number of delay circuits.

Further, in each of the above-described Embodiments 1 and 2, the signal delay means of such a type as switching number of gate stages is employed to serve as the timing control circuit 16a. However, any other arrangement can be employed.

Figure 7:
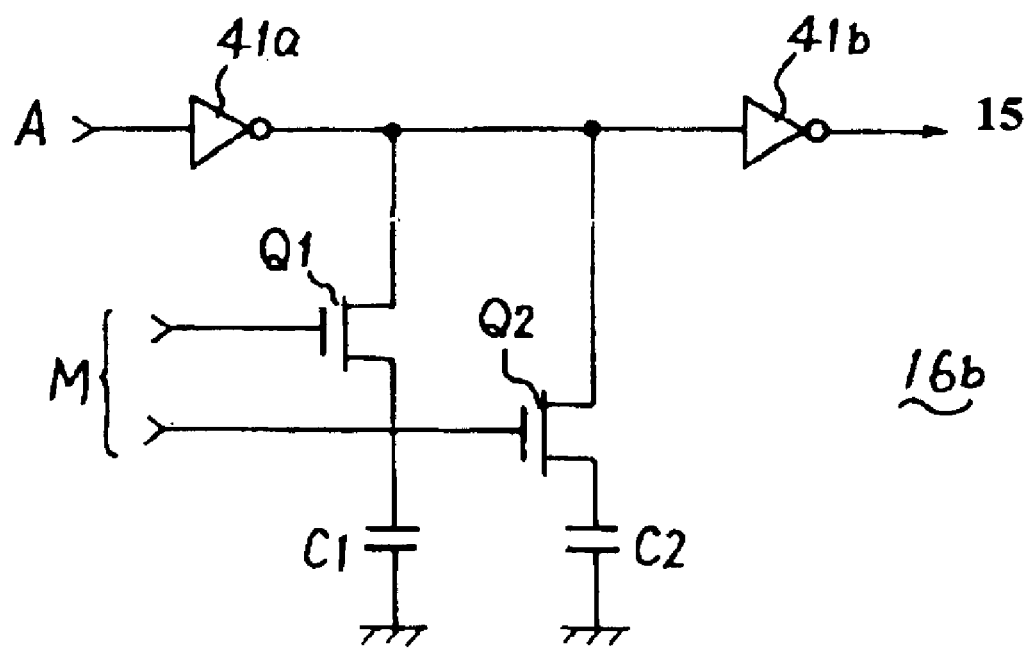
FIG. 7 is a circuit diagram showing an arrangement of signal delay means of a type for switching a load-carrying capacity used as the timing control circuit.
Figure 17:
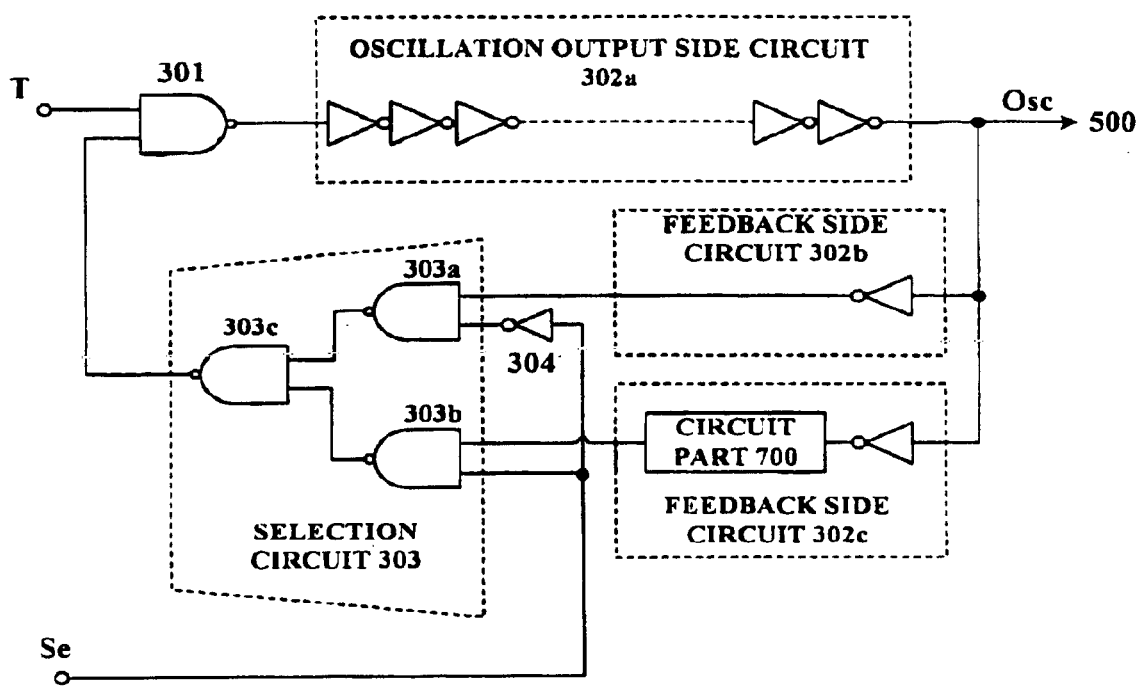
FIG. 17 is a circuit diagram showing a detailed arrangement of an oscillation circuit used in the process monitor circuit of the semiconductor device according to Embodiment 5 of the invention.

For example, signal delay means 16b shown in FIG. 17 is of a type of switching load-carrying capacity. That is, in the arrangement shown in FIG. 7, a first series circuit consisted of a MOS transistor Q1 and a capacitor C1, and a second series circuit consisted of a MOS transistor Q2 and a capacitor C2 are connected respectively between two inverters 41a, 41b cascade-connected. By inputting the monitor signal M to the gate of each MOS transistor Q1 or Q2, the load-carrying capacities C1, C2 are switched to be capable of controlling the delay amount of the input signal A.

Figure 8:
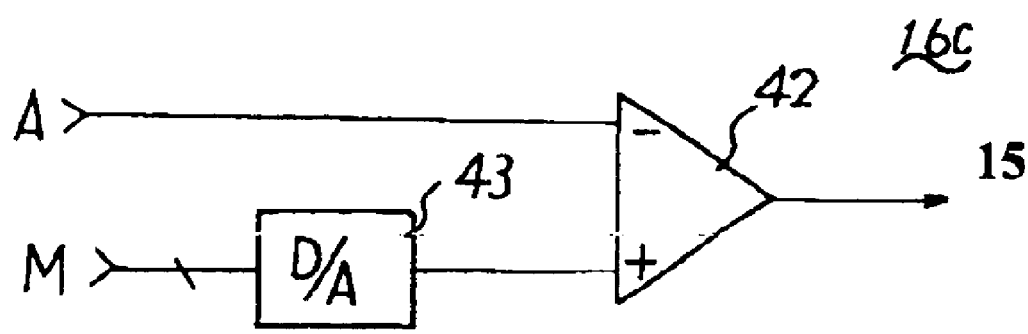
FIG. 8 is a circuit diagram showing an arrangement of the signal delay means of comparator type used as the timing control circuit.

Furthermore, signal delay means 16c shown in FIG. 8 is of a comparator type. That is, in the arrangement shown in FIG. 8, the monitor signal M is applied as a reference signal Vref to one input terminal of a comparator 42 via a D/A converter 43. Further, the input signal A toward the circuit element 15 is applied to the other input terminal (−) of the comparator 42.

Figure 9:
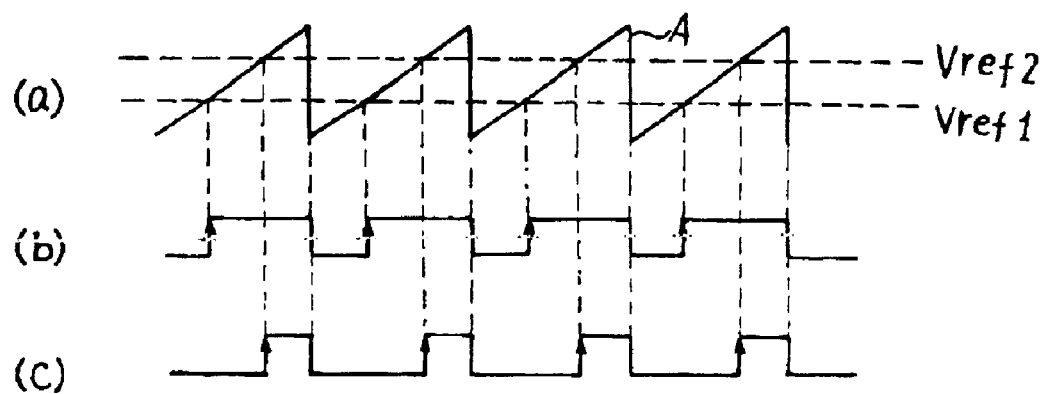
FIG. 9 is a signal waveform diagram for explaining operation of the signal delay means of FIG. 8.

In such an arrangement, as shown in FIG. 9, a reference signal applied to the input terminal (+), being one of the input terminals of the comparator 42, changes to Vref1 or Vref2 depending on the monitor signal M. Therefore, in the case that the input signal A inputted to the input terminal (−) of the comparator 42 has such a signal waveform as shown in FIG. 9(a), the signal outputted from the comparator 42 comes to be a square wave as shown in FIG. 9(b) or 9(c) in response to the mentioned Vref1, Vref2. Further, for example, when the circuit element 15 operates at the leading edge of the square wave, operation timing becomes more delayed in the case of FIG. 9(c) than in the case of FIG. 9(b). In this manner, in the signal delay means of comparator type, the monitor signal M causes the reference signal to change to Vref1, Vref2 whereby the delay amount of the input signal A is controlled.

Figure 10:
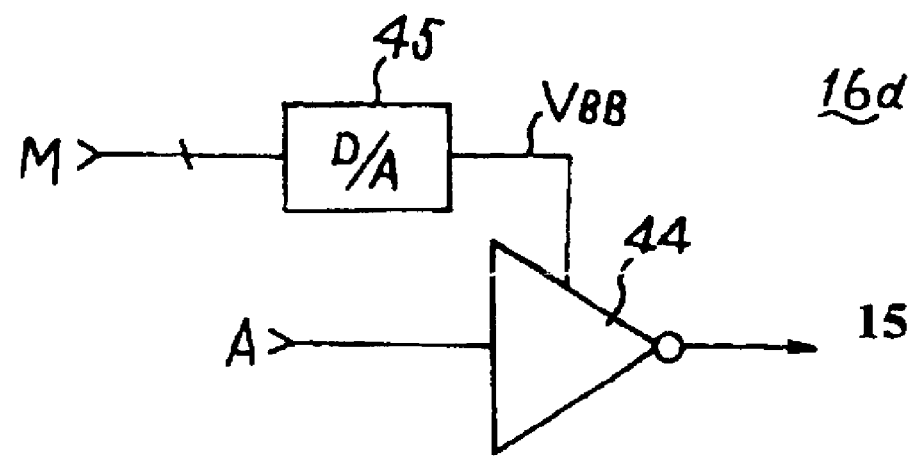
FIG. 10 is a circuit diagram showing an arrangement of the signal delay means of a type for switching source voltage used as the timing control circuit.

In addition, signal delay means shown in FIG. 10 is of a type of switching a source voltage. That is, in the arrangement shown in FIG. 10, the monitor signal M is applied as a source voltage VBB of an inverter 44 via a D/A converter 45. Further, the monitor signal M causes the source voltage VBB of the inverter 44 to be varied, whereby the delay amount of the input signal A passing through the inverter 44 is controlled.

Furthermore, in each of the above-described Embodiments 1 and 2, an example in which one process monitor circuit is mounted on the same semiconductor chip is described. However, it is also possible that a plurality of process monitor circuits are disposed in a scattered manner at arbitrary positions on the semiconductor chip, and the fluctuation in process at each position on the same semiconductor chip is monitored by means of each process monitor circuit. Then in accordance with the result of monitoring, operation timing of the circuit block in the proximity of the process monitor circuit can be appropriately controlled. In such an arrangement, not only any process fluctuation in each semiconductor device but also any fluctuation at formation points on the same semiconductor chip can be debugged, which is more advantageous.

Additionally, in each of the above-described Embodiments 1 and 2, the process monitor circuit is mounted on the same semiconductor chip. However, it is also possible that at least one process monitor circuit is disposed on a semiconductor wafer and in the vicinity of the semiconductor chip, and the fluctuation in process at each position on the semiconductor wafer is monitored by means of each process monitor circuit. Then in accordance with the result of monitoring, operation timing of the circuit blocks 2a to 2n on the semiconductor chip in the proximity of the process monitor circuit is appropriately controlled. In such an arrangement, it is not necessary to mount any process circuit on the semiconductor chip, thus a further circuit block can be mounted at the portion secured by not mounting any process circuit.

Embodiment 3

Figure 11:
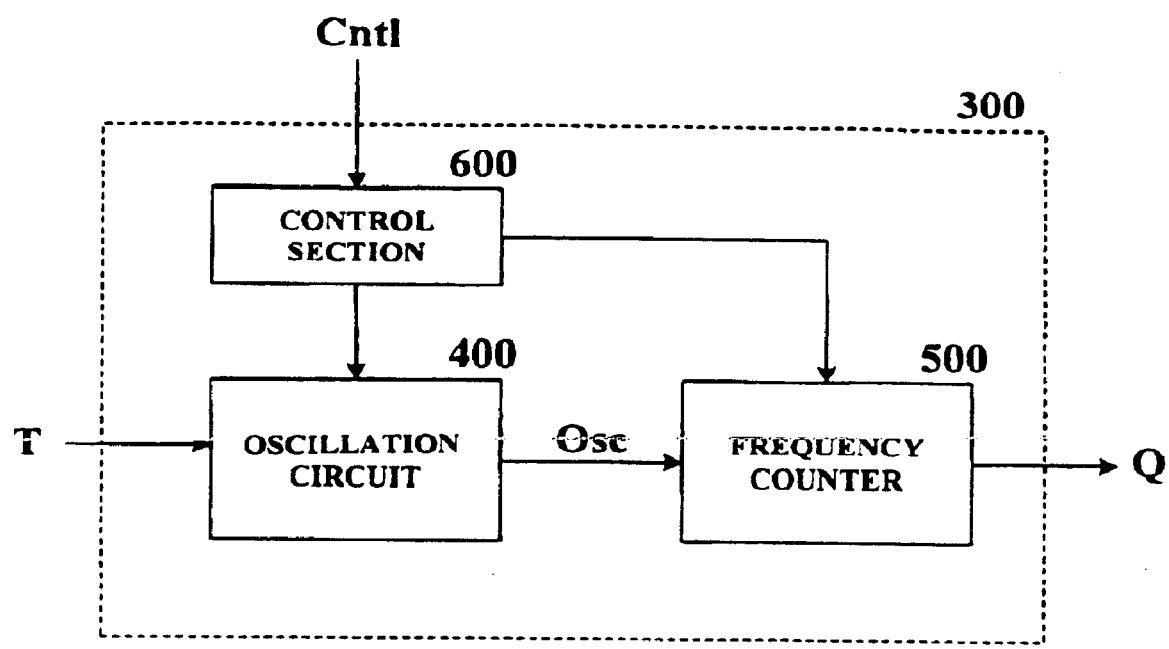
FIG. 11 is a block diagram showing an arrangement of the semiconductor device provided with a process monitor circuit according to Embodiment 3 of the invention.

FIG. 11 is a block diagram showing an arrangement of the semiconductor device provided with a process monitor circuit according to Embodiment 3 of this invention.

In the semiconductor device according to this embodiment, at least one process monitor circuit 300 that monitors the fluctuation in process and outputs a result thereof to outside is mounted on the same semiconductor chip or in the vicinity of the semiconductor chip on the semiconductor wafer.

In this embodiment, the process monitor circuit 300 is provided with an oscillation circuit 400 that oscillates at a predetermined frequency, a frequency counter 500 that measures oscillation frequency of the oscillation circuit 400, and a control section 600 that is connected to the oscillation circuit 400 and to the frequency counter 500 and controls operation sequence of the whole process monitor circuit 300.

Figure 12:
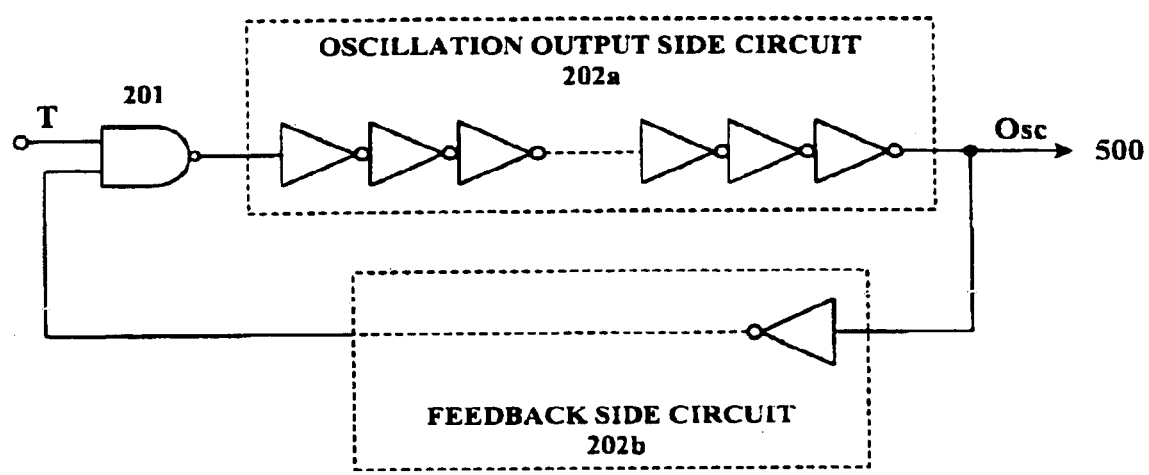
FIG. 12 is a circuit diagram showing a detailed arrangement of an oscillation circuit used in the process monitor circuit of the semiconductor device according to Embodiment 3.

As the above-described oscillation circuit 400, for example, as shown in FIG. 12, a ring oscillator is used. The ring oscillator is provided with the a NAND gate 201 of two inputs, an oscillation output side circuit 202*a* in which inverters are cascade-connected to an output part of the NAND gate 201, and a feedback side circuit 202*b* in which inverters are connected so as to feed back a part of the oscillation output from the oscillation output side circuit 202*a* to one of the input terminals of the NAND gate 201. The signal T of the oscillation start/stop is inputted from outside to the other input terminal of the NAND gate 201.

The frequency counter 500 inputs an output signal Osc from the above-described oscillation circuit 400, calculates the oscillation frequency of the oscillation circuit 400, and outputs a count value thereof to outside as an output value Q.

The control section 600 performs such functions as receiving an external control signal Cntl, initially setting the oscillation circuit 400 and the frequency counter 500, and outputting to outside a counting value n of the frequency counter 500.

Figure 13:
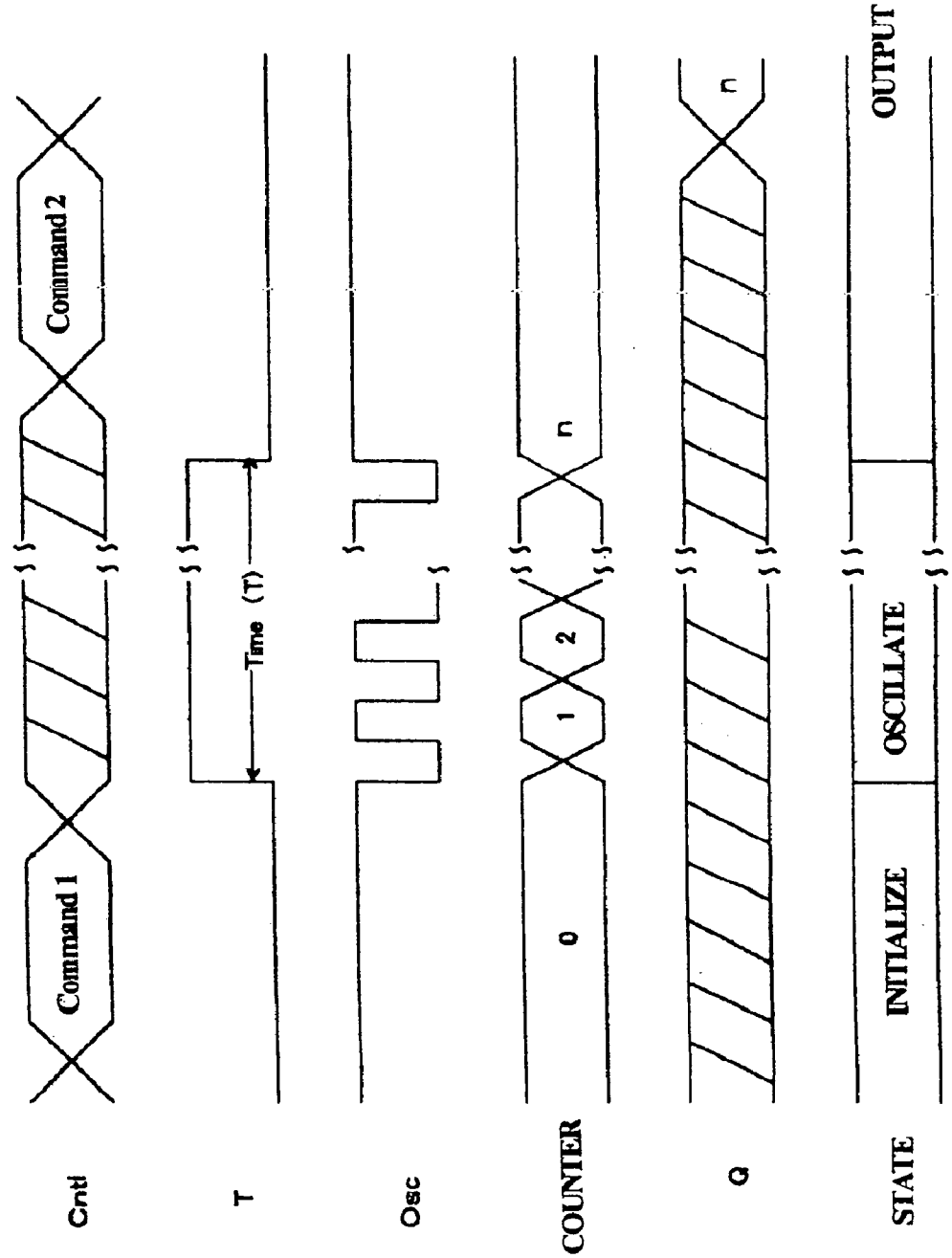
FIG. 13 is a time chart showing a monitor operation by means of the process monitor circuit according to Embodiment 3.

Now, monitoring operation by means of the process monitor circuit according to Embodiment 3 is hereinafter described with reference to a time chart of FIG. 13.

First, a setting command Command1 is input to the control section 600 as the external control signal Cntl. Using this setting command Command1, the control section 600 initially sets the oscillation circuit 400 and the frequency counter 500, and then puts the process monitor circuit 300 into an operation.

Then, when a "H" level signal is inputted as the external signal T, the oscillation of the oscillation circuit 400 is started, and the Osc signal comes to be an oscillation waveform. Upon receiving this Osc signal, the frequency counter 500 starts counting operation.

When the external signal T inputted to the oscillation circuit 400 becomes "L" level, the oscillation of the oscillation circuit 400 stops. Then, the counting operation at the frequency counter 500 stops, and a count value n is held.

Now, a setting command Command2 is inputted to the control section 600 as the external control signal Cntl. Upon receiving the setting command Command2, the control section 600 outputs to outside the count value n of the frequency counter 500 as an output signal Q.

As described above, in this Embodiment 3, without any special and dedicated external device, just by using a simple and general-purpose semiconductor test apparatus, fluctuation in manufacturing process of the semiconductor device can be monitored.

Further, a simple control on a command base by means of the control section 600 becomes possible, measurement is simple, and time and development cost for developing a program and the like will be reduced.

Furthermore, there are a small number of control terminals, and therefore overheads (area, jig or the like) are less required for the applied product.

In the mentioned prior art (particularly in the Japanese Patent Publication (unexamined) No. 127186/1997), it is arranged so as to output the result of comparison to outside. On the other hand, in the process monitor circuit according to this embodiment, the count value of the frequency counter can be directly outputted. This means that not only the result of defective or not can be detected, but also analogous performance of the semiconductor device can be detected.

Embodiment 4

Embodiment 4 of the invention modifies the arrangement of the oscillation circuit of the process monitor circuit according to the foregoing Embodiment 3 in order to enhance monitoring accuracy in monitoring fluctuation in process of the semiconductor device.

Figure 14:
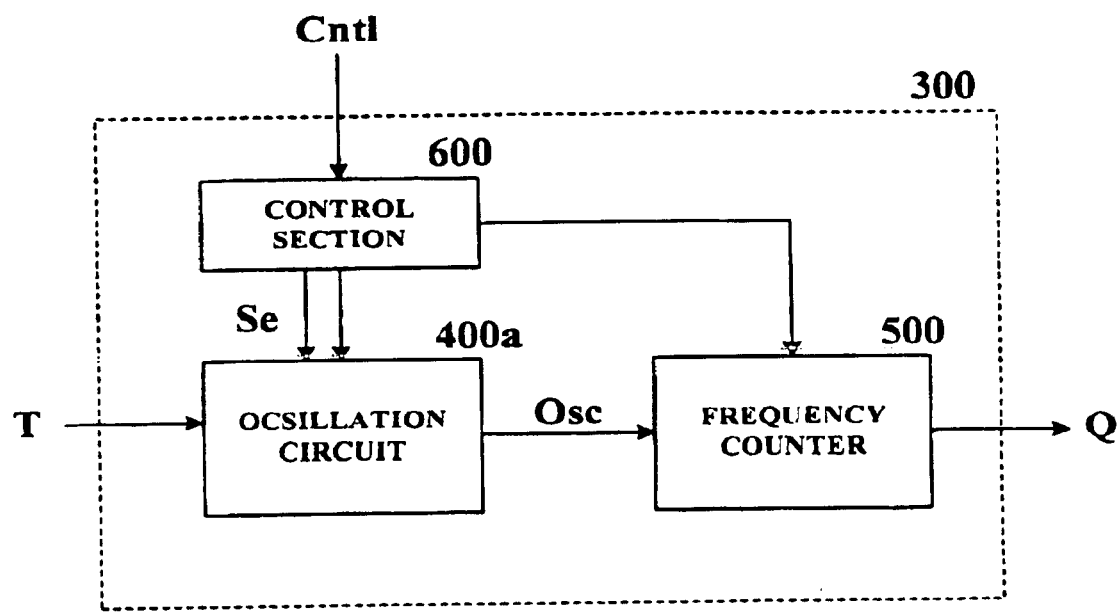
FIG. 14 is a block diagram showing an arrangement of the semiconductor device provided with a process monitor circuit according to Embodiment 4 of the invention.

FIG. 14 is a block diagram showing an arrangement of the semiconductor device provided with a process monitor circuit according to Embodiment 4.

Referring to the drawing, the process monitor circuit 300 for monitoring the fluctuation in process is provided with an oscillation circuit 400*a* that oscillates at mutually different frequencies respectively in response to an selection signal Se outputted by the control section 600 upon receiving the external signal Cntl. The other arrangement is the same as in the foregoing Embodiment 3 (FIG. 11).

Figure 15:
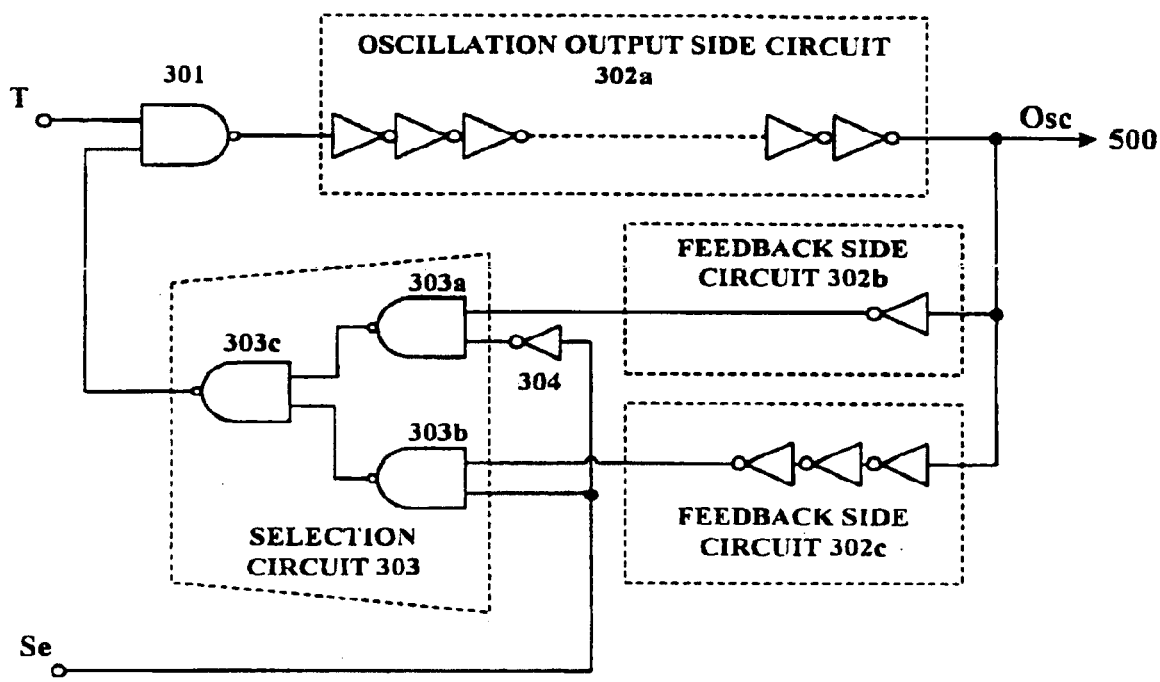
FIG. 15 is a circuit diagram showing a detailed arrangement of an oscillation circuit used in the process monitor circuit of the semiconductor device according to Embodiment 4.

As shown in FIG. 15, the oscillation circuit 400*a* according to Embodiment 4 is provided with, for example, a NAND gate 301 of two inputs, and an oscillation output side circuit 302*a* in which inverters are cascade-connected to an output part of the NAND gate 301; biserial feedback side circuits 302*b* and 302*c* that are constituted of inverters so as to feed back a part of the oscillation outputs from the oscillation output side circuit 302*a* to one of the input terminals of the NAND gate 301; and a selection circuit 303 that selects either one of the outputs from the biserial feedback circuits 302*b*, 302*c*. In addition, it is essential that paths of the above-described circuit elements 301, 302*a* 302*b* (302*c*), 303*a* (303*b*), 303*c* are arranged so as to be oscillated.

In this arrangement, the upper and lower biserial feedback circuits 302*b*, 302*c* is set so that number of stages of the inverters may be mutually different in each series. That is, in this Embodiment 4, in the two biserial feedback side circuits 302*b*, 302*c*, the circuit 302*b* being one of the feedback side circuits is provided with an inverter of one stage, while the other circuit 302*c* is provided with inverters of three stages. Accordingly, a difference in number of stages between the inverters of upper and lower series is two. The difference in number of these stages, however, is not limited thereto. But the difference in number of stages can be set properly within the range of producing any difference in oscillation frequency enough to be capable of monitoring the process fluctuation in element characteristic.

The selection circuit 303 is comprised, for example, of three NAND gates 303*a*, 303*b*, and 303*c* each of two inputs. At the NAND gate 303*a*, one of the input terminals thereof is connected to the output from the above-described feedback side circuit 302*b*, and the other input terminal is connected to the selection signal Se line from the control section 600 via an inversion element 304. At the NAND gate 303*b*, one of the input terminals is connected to the output from the mentioned feedback side circuit 302c, and the other input terminal of the NAND gate 303b is connected to the selection signal Se line from the control section 600.

In addition, the signal T for executing a start/stop of the oscillation is inputted from the outside to the other input terminal IN3 of the NAND gate 301.

Figure 16:
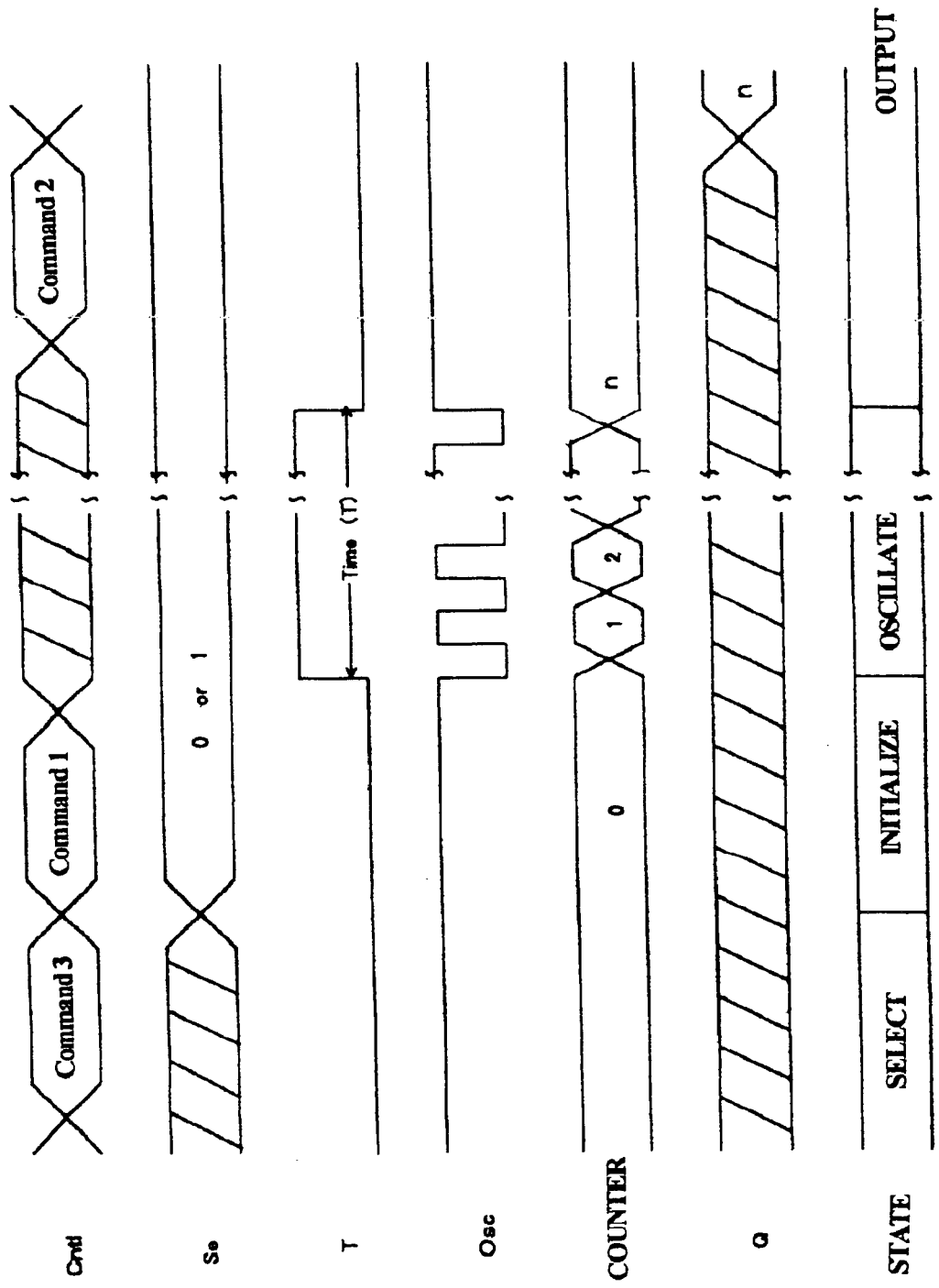
FIG. 16 is a time chart showing a monitor operation by means of the process monitor circuit according to Embodiment 4.

Now, monitor operation by means of the process monitor circuit according to Embodiment 4 is hereinafter described with reference to a time chart of FIG. 16.

First, a setting command Command3 is input to the control section 600 as the external control signal Cntl. With this setting command Command3, the control section 600 determines the selection signal Se, outputs this selection signal Se to the oscillation circuit 400a, and selects either of the upper and lower biserial feedback side circuits of the oscillation circuit 400a. In this process, two types of signals of "H" level and "L" level are used as the selection signal Se. When the "H" level is selected as the selection signal Se, the output from the circuit 302b, being one of the feedback side circuits of a ring oscillator of FIG. 15 is selected. On the other hand, when the "L" level is selected as the selection signal Se, the output from the other circuit 302c on the feedback side is selected.

Then, the setting command Command1 is input to the control section 600, as the external control signal Cntl. With this setting command Command1, the control section 600 initially sets the oscillation circuit 400a and the frequency counter 500, and then puts the process monitor circuit 300 into an operation.

Under such a state, when the "H" level is inputted to the oscillation circuit 400a as the external signal T, the oscillation circuit 400a starts oscillation, and an Osc signal comes to form an oscillation waveform. Upon receiving this Osc signal, the frequency counter 500 starts counting operation.

When the external signal T with respect to the oscillation circuit 400a becomes "L" level, the oscillation of the oscillation circuit 400 is stopped. Also, the counting operation at the frequency counter 500 is stopped, and a counting value n is held.

Subsequently, the setting command Command2 is inputted to the control section 600 as the external control signal Cntl. Upon receiving this setting command Command2, the control section 600 outputs the counting value n of the frequency counter 500 to outside as the output signal Q.

In this embodiment, a difference between the circuit 302b being one of the feedback side circuits of the oscillation circuit (ring oscillator) and the other circuit 302c corresponds to two stages of inverters. It is supposed herein that a time period of "H" level of the external signal T, i.e., an oscillating operation time is a constant Time (T), and outputs for operating both of the feedback side circuits are Q1, Q2 respectively. Then a delay time corresponding to one stage of inverter can be calculated in the following expression.

|Time(T)/Q1−Time(T)/Q2|/4     (1)

As described above, in this Embodiment 4, it becomes possible to measure the delay time of psec order in a short time as well as in a high accuracy using a simple and general-purpose semiconductor test apparatus without any special and dedicated external device.

In the foregoing Embodiment 3 or 4, an inverter is employed as a circuit element forming the oscillation circuits 400, 400a is described. However it is also preferable that any other circuit element is used.

For example, in this Embodiment 4, it is preferable that a NAND element is used in place of the biserial inverters on the feedback side. Also in this case, in the similar method to that described above, the delay time corresponding to one stage of the NAND element can be measured in a short time as well as in a high accuracy.

Furthermore, in this Embodiment 4, it is preferable that any element to which any wire capacity is intentionally added and any element, to which it is not added, may be used in substitution for the biserial inverters on the feedback side. For example, it is herein supposed that elements in which a difference is added to a wire length although number of gates of the transistor is identical, is disposed at the biserial circuits on the feedback side. Then effect in the wire addition capacity can be monitored based on a difference in oscillation frequencies of the biserial circuits. That is, the effect can be measured in a short time as well as in a high accuracy by means of a simple semiconductor test apparatus without any special and dedicated external device. As a result, a correlation between a model of wire addition capacity in circuit simulation and an actually finished device can be observed. Thus, improvement in accuracy of the simulation and an improvement in yield rate can be achieved.

Embodiment 5

FIG. 17 is a circuit diagram showing an oscillation circuit of a process monitor circuit according to Embodiment 5 of the invention.

In this embodiment, the mentioned biserial feedback side circuit in the foregoing Embodiment 4 is basically comprised of identical circuit elements such as inverters, and further a predetermined circuit part intended to monitor a speed is added to either one of the feedback side circuits. Then, the biserial feedback side circuits are put into oscillation on the same conditions, and a difference between the counter values is obtained, whereby a propagation rate of the circuit part 700 to be monitored can be measured. As the circuit part 700 to be monitored, a delay circuit used in timing compensation of the circuit such as resistance or capacitor is disposed. In addition, it is essential that paths of the above-described circuit elements 301, 302a 302b (302c), 303a (303b), 303c are arranged so as to be oscillated.

As described above, in this Embodiment 5, the circuit part, which is intended to be monitored, can be measured in a short time as well as in a high accuracy (psec order) using a simple semiconductor test apparatus without any special and dedicated external device. In particular, by monitoring the delay circuit used in timing compensation of the circuit such as resistance or capacitor, a correlation between a timing compensating delay circuit in the circuit simulation and an actually finished device can be observed. Consequently, accuracy in simulation and yield rate can be improved.

Embodiment 6

An output of the process monitor circuit is different for each sample due to variation in manufacturing process. That is, an expectation value of an output (count value) in order to detect whether or not the process monitor circuit itself is correctly designed, or whether or not the process monitor circuit is correctly manufactured, is not always simply determined.

To cope with this, an object of this Embodiment 6 is to provide a self-diagnosis circuit for diagnosing the process monitor circuit itself.

Figure 18:
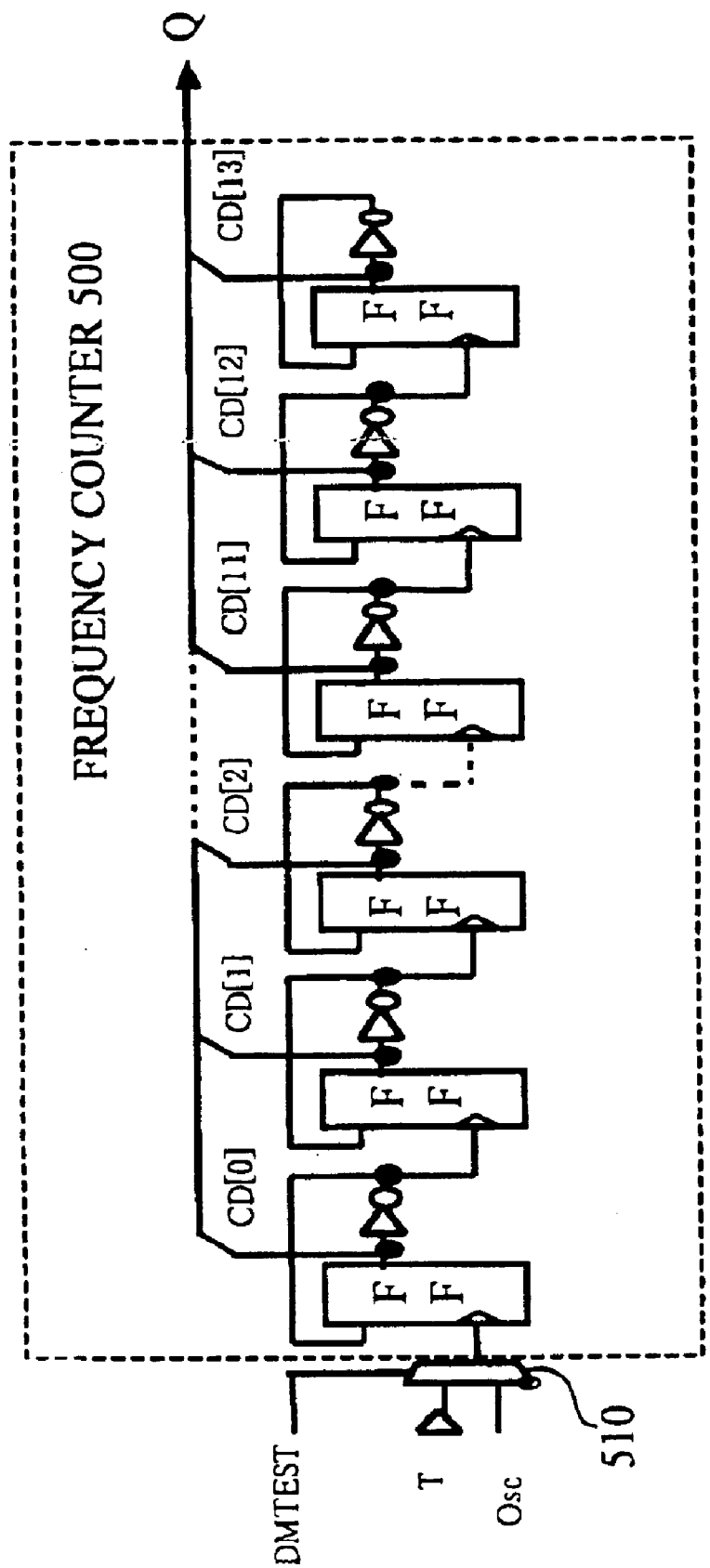
FIG. 18 is a block diagram showing a self-diagnosis circuit of a process monitor circuit according to Embodiment 6.
Figure 19:
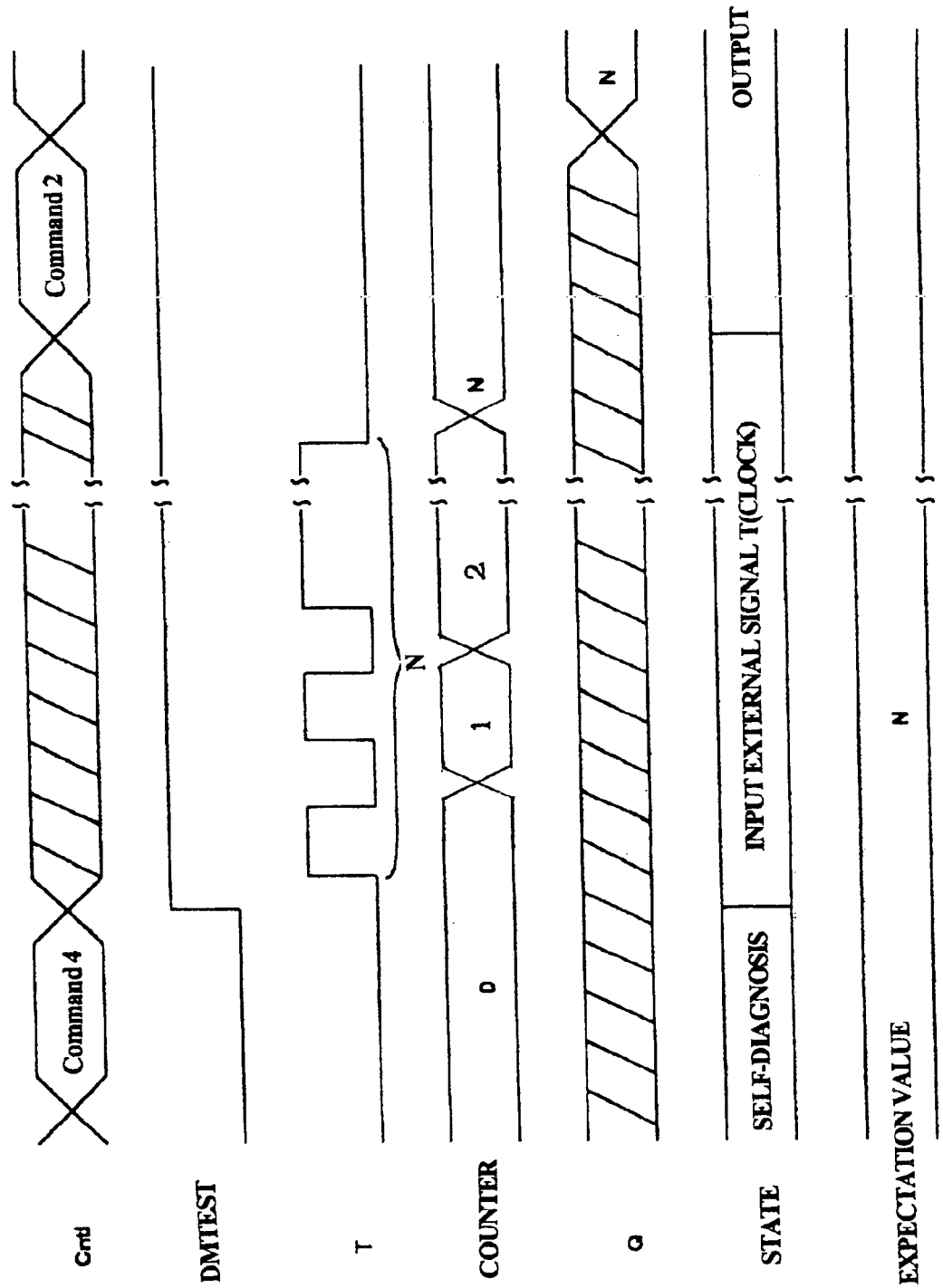
FIG. 19 is a timing chart showing self-diagnosis operation of the process monitor circuit according to Embodiment 6.

FIG. 18 is a block diagram showing a self-diagnosis circuit for diagnosing the process monitor circuit according to Embodiment 6, and FIG. 19 shows a timing chart showing self-diagnosis operation of the process monitor circuit according to Embodiment 6.

Referring to FIG. 18, a frequency counter 500 is comprised, for example, of fourteen stages of flip-flops cascade-connected, and a test selection circuit 510 is connected to an input side of the frequency counter 500. A test circuit 510 selects either of the external signal T or the output signal Os from an oscillation circuit 400 to input it to the frequency counter 500. At this time, the test selection circuit 510 selects the external signal T when a DMTEST signal is of "L" level, while selecting the output signal Osc when the DMTEST signal is of "L" level.

Now, the self-diagnosis operation of the process monitor circuit according to Embodiment 6 is hereinafter described with reference to the time chart of FIG. 19.

First, a setting command Command4 is inputted to the control section 600 as the external control signal Cntl. In response to this setting command Command4, the control section 600 outputs the DMTEST signal of the "H" level to the test selection circuit 510. Accordingly, the test selection circuit 510 selects the external signal T to input it to the frequency counter 500. Then, the frequency counter 500 counts number of oscillation times of the external signal T. At this time, by setting the external signal T to oscillate only by a predetermined number of times N, whether or not an output value Q of the frequency counter 500 is N, is confirmed.

As described above, according to this Embodiment 6, it becomes possible to inspect whether or not the process monitor circuit is correctly designed.

Embodiment 7

Embodiment 7 makes a control interface of the process monitor circuit 300 according to the above-described embodiment in compliance with JTAG (Joint Test Action Group; formally, Standard Test Access Port and Boundary-Scan Architecture).

Figure 20:
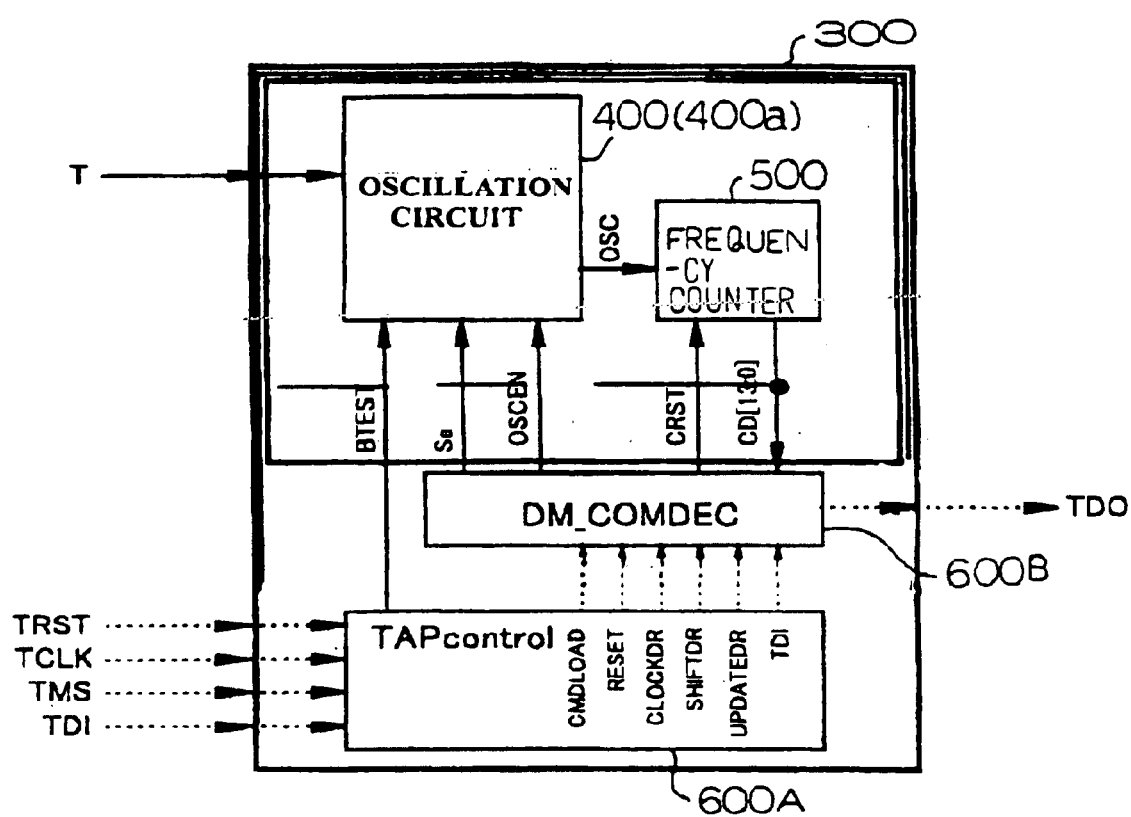
FIG. 20 is a block diagram showing a process monitor circuit in compliance with JTAG according to Embodiment 7.

FIG. 20 is a block diagram showing the process monitor circuit compliant with the JTAG. In the drawing, the process monitor circuit 300 is provided with a TAP controller 600A and a command decoder (DM_COMDEC) 600B forming a control section 600 for controlling an operation sequence of the process monitor circuit 300, in addition to the oscillation circuit 400 that oscillates at a predetermined frequency and the frequency counter 500 that measures oscillation frequency of the oscillation circuit 400.

A TDI signal that serially inputs a command or data to a test logic, a TCK signal that supplies a clock to the test logic, a TMS signal that controls the test operation, and a TRST signal resetting the TAP controller are inputted to the TAP controller 600A. Furthermore, a TDO signal that serially outputs the data from the test logic is outputted from the command decoder 600B. Then, by controlling these signals at an external host computer, a test compliant with JTAG is carried out.

It is this TAP controller 600A that executes the control playing a central role in the JTAG test, and an operation thereof is represented in the form of transition of 16 states. A state shifts in the combination of the TCK signal and the TMS signal, and input data of the TDI signal are read at a ShiftDR (shift data register) or a ShiftIR (shift instruction register). The read data of the TDI signal means a control command. A command decoder 600B executes definition of the control command and circuit operation. Then, the circuit operation of the oscillation circuit 400, the frequency counter 500, etc. is controlled by means of the command decoder 600B.

In this Embodiment 7, number of control pins can be reduced. On condition that there is any interface compliant with JTAG in the semiconductor device, the control can be applied to others. Furthermore, the whole control is standardized, and extensive application of inspection and measurement program becomes possible, and development of object to be measured such as plural types of semiconductor devices becomes easy.

Embodiment 8

In this embodiment, the process monitor circuit 3a or 3b according to the foregoing Embodiment 1 or 2 is provided with the control section 600 that controls operation sequence of the overall process monitor circuit.

Figure 21:
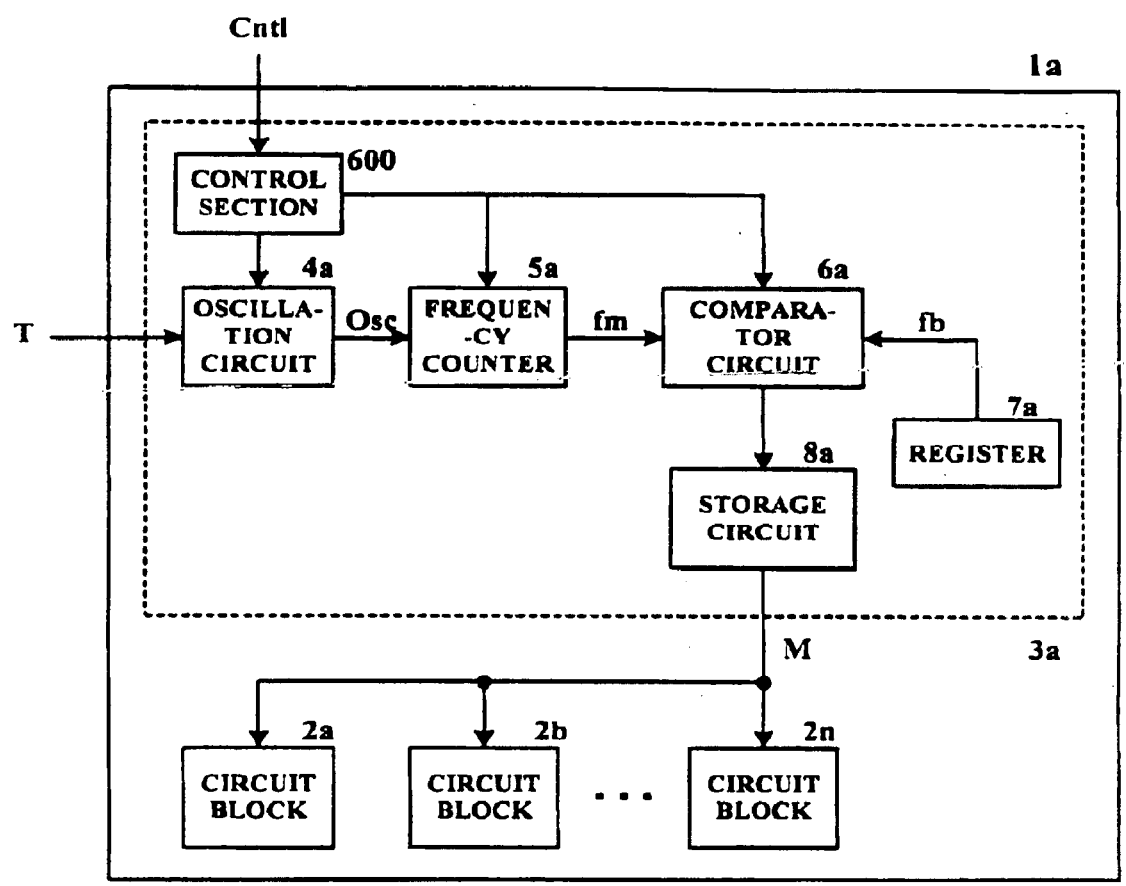
FIG. 21 is a block diagram showing an arrangement of the semiconductor device provided with a process monitor circuit according to Embodiment 8.

FIG. 21 is a block diagram of a semiconductor device provided with a process monitor circuit according to Embodiment 8. FIG. 21 shows the process monitor circuit 3a according to Embodiment 1 provided with a control section that controls operation sequence of the whole process monitor circuit.

Referring to the drawing, the control section 600 serves several functions to control the operation sequence of the entire process monitor circuit. Those functions include initially setting the oscillation circuit 4a and the frequency counter 5a upon receiving the external control signal Cntl, outputting a count value fm of the frequency counter 5a to the comparator circuit 6a, controlling the comparison operation in the comparator circuit 6a, outputting the monitor signal M from the process monitor circuit 3a to each of the circuit blocks 2a to 2n, and so on.

As described above, in this embodiment, the fluctuation in the manufacturing process of the semiconductor device can be monitored without any special and dedicated external device. Furthermore, the fluctuation in the process can be debugged.

Embodiment 9

Embodiment 9 relates to a test method of the semiconductor device provided with a process monitor circuit. In this test method, the self-diagnosis for the process monitor circuit according to the foregoing Embodiment 6 is carried out before the process monitoring step of the semiconductor device provided with the process monitor circuit described in the foregoing Embodiments 3 to 5, or Embodiments 7 and 8.

Figure 22:
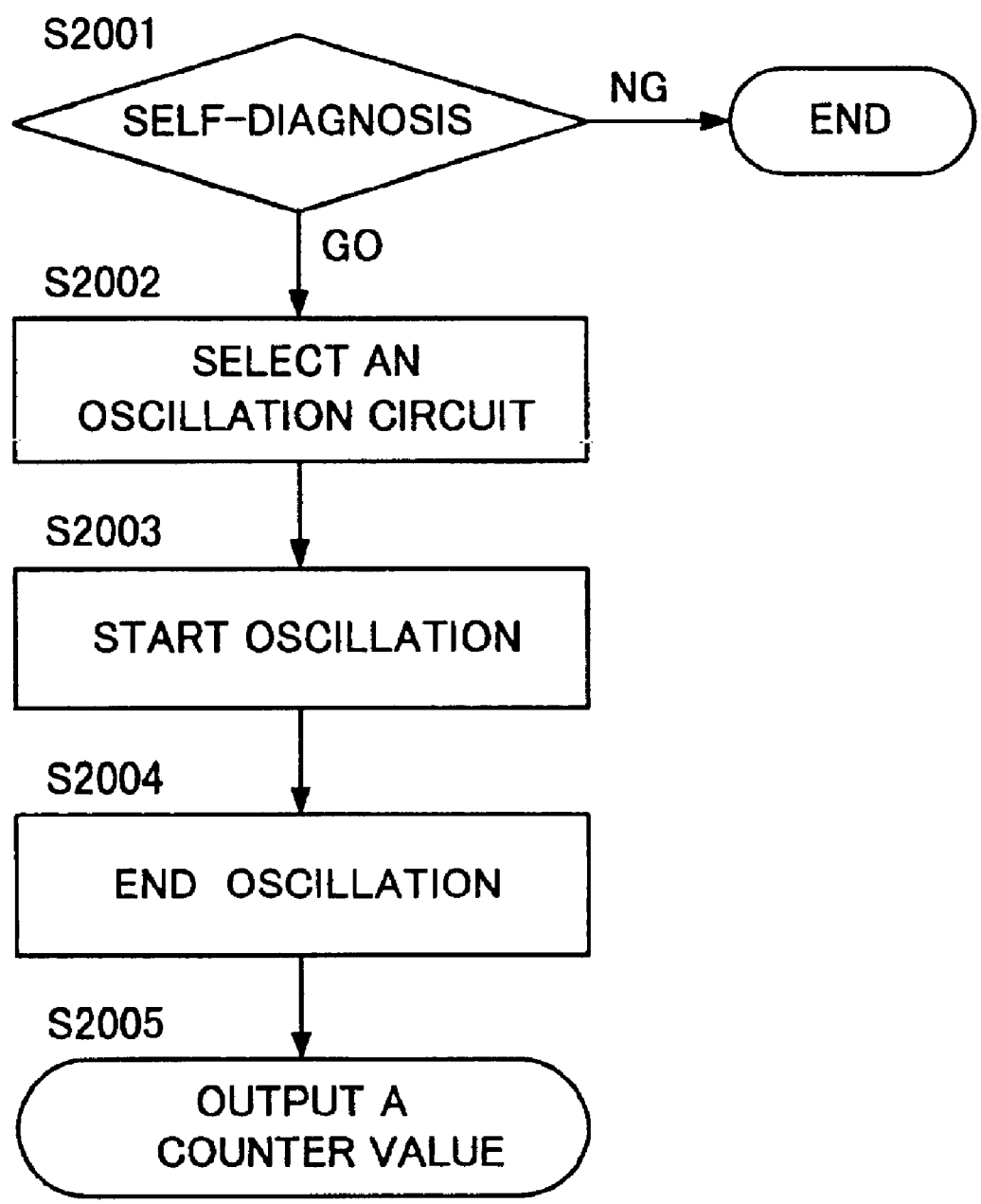
FIG. 22 is a flowchart of a manufacturing method of the semiconductor device provided with a process monitor circuit according to Embodiment 9.

FIG. 22 is a flowchart showing one example of the test method of the semiconductor device provided with the process monitor circuit according to this embodiment.

In the flowchart, first, the self-diagnosis step for diagnosing the process monitor circuit 300 described in the foregoing Embodiment 6 is carried out (S2001). Only in the case of GO in this self-diagnosis step, the steps of selecting an oscillation circuit for the process monitor circuit (S2002), starting oscillation operation of the oscillation circuit (S2003), ending the oscillation operation of the oscillation circuit (S2004), and outputting a counter value of the frequency counter (S2005) are carried out. On the contrary, in the case of NG in the self-diagnosis step (S2001) for diagnosing the process monitor circuit 300, the steps related to the process monitor circuit 300 are not carried out, and this test method proceeds to a subsequent step.

In this embodiment, the self-diagnosis for diagnosing the process monitor circuit is carried out before the process-monitoring step, and therefore a highly reliable process monitoring of the semiconductor device can be conducted.

In addition, a test for the semiconductor device can be implemented in a short time as well as in a high accuracy using a simple semiconductor test apparatus without any special and dedicated external device.

Embodiment 10

Embodiment 10 relates to a test method of the semiconductor device provided with a process monitor circuit. Measurement using the process monitor circuit is carried out plural times in the steps of manufacturing the semiconductor device, and applied to a process control.

Figure 23:
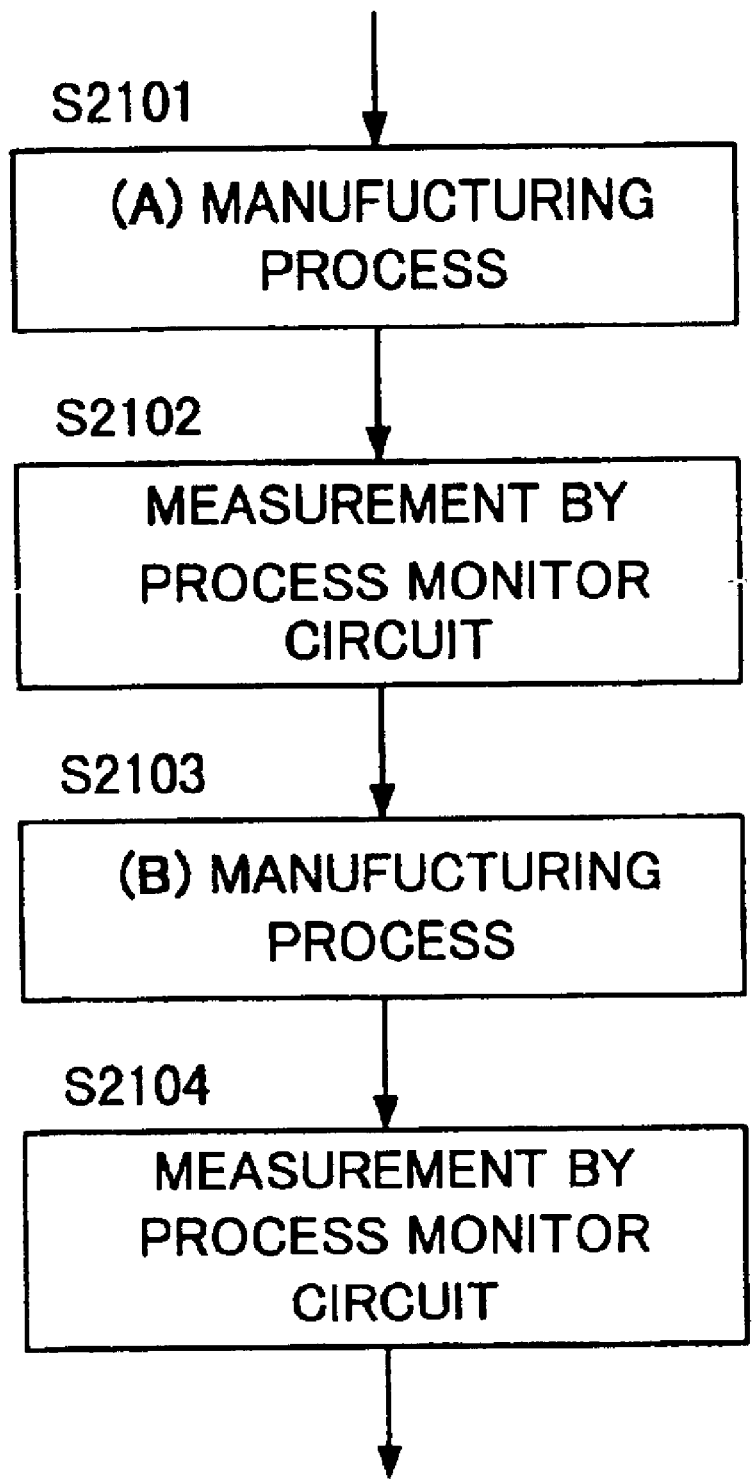
FIG. 23 is a flowchart of a manufacturing method of the semiconductor device provided with a process monitor circuit according to Embodiment 10.

FIG. 23 is a flowchart of a test method of a semiconductor device provided with the process monitor circuit according to Embodiment 10.

In the flowchart, after completing A manufacturing process (S2101), measurement by means of the process monitor circuit 300 (S2102) described in the foregoing embodiments is carried out. Further, after completing B manufacturing process (S2103), measurement by means of the process monitor circuit 300 (S2104) is carried out.

At a point of time when any abnormality has been found in a result of measurement by means of the process monitor circuit 300, it becomes clear that there is a cause in the manufacturing process preceding the measurement. For example, in the case that abnormal data is detected in the result of measurement by means of the process monitor circuit in S2104, it means that there is a cause in the B manufacturing process preceding the measurement in S2104.

More specifically, both of a semiconductor in which transistors of the oscillation circuit of the process monitor circuit 300 are formed by the time of manufacturing a first layer wiring, and that in which transistors are formed at the time of manufacturing a second layer wiring are provided in the same semiconductor wafer or semiconductor chip. After completing the respective wiring and formation of the transistor, the measurement using the process monitor circuit is carried out.

In this embodiment, the measurement by the process monitor circuit is implemented plural times in the semiconductor manufacturing process, and therefore any abnormality can be discovered at each stage of the manufacturing process. Consequently any cause of defect can be made clear early. As a result, improvement in yield rate in the later steps can be achieved, and thus manufacturing cost of the semiconductor device can be reduced.

In the above-described embodiment, it is also preferable that not only the measurement by the process monitor circuit conducted in the semiconductor manufacturing process but also determination step thereafter may be additionally provided.

Figure 24:
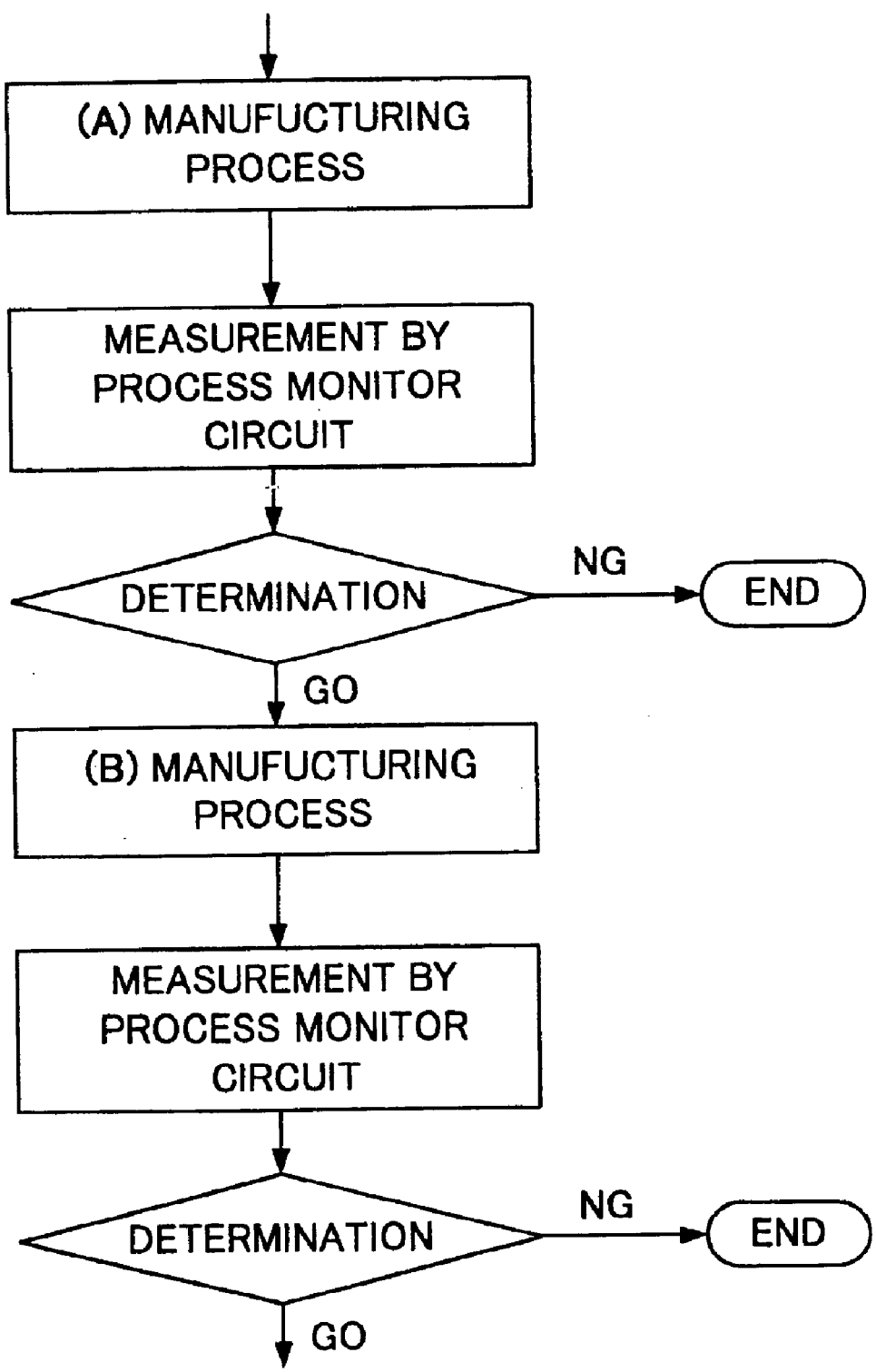
FIG. 24 is another flowchart of the manufacturing method of the semiconductor device provided with a process monitor circuit according to Embodiment 10.

FIG. 24 is a flowchart providing such a determination step after the measurement using the process monitor circuit. Any semiconductor chip in which a defect has been found (i.e., NG is generated) at any determination step, becomes out of object in the manufacturing process of the semiconductor at this point.

That is, after dividing (dicing) into individual chips of semiconductor from the state of semiconductor wafer, such a NG semiconductor chip is not delivered to a subsequent step.

In this manner, cost can be reduced, and yield rate in the subsequent steps can be improved.

Embodiment 11

This embodiment relates to a test method of a semiconductor device provided with a process monitor circuit. Reading or determination of a measured value by the process monitor circuit is programmed into a test step of the semiconductor device, for example, the test step of a semiconductor wafer level.

Figure 25:
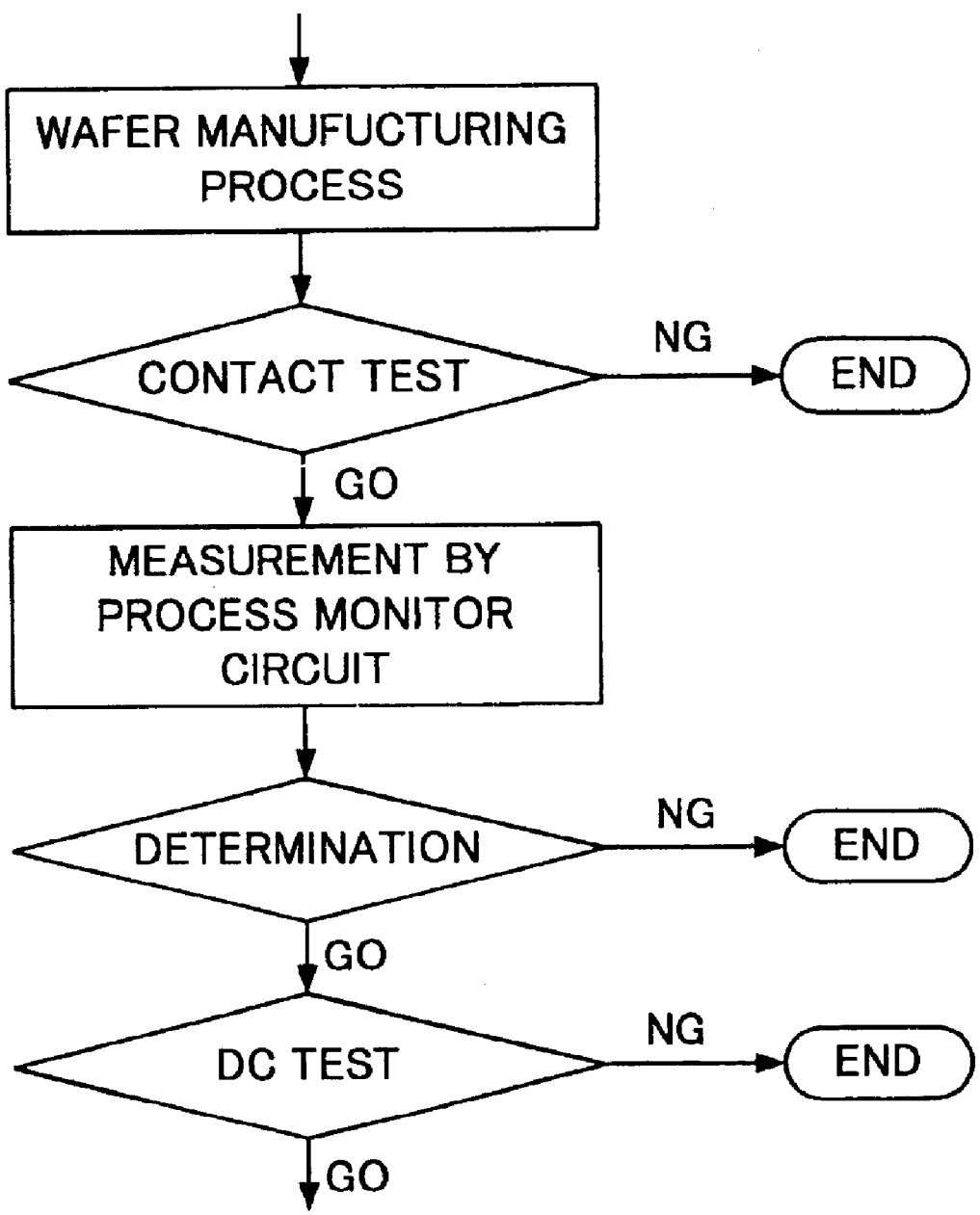
FIG. 25 is a flowchart showing a test method of the semiconductor device provided with a process monitor circuit according to Embodiment 11.

FIG. 25 is a flowchart showing a test method of the semiconductor device provided with a process monitor circuit according to Embodiment 11.

It is possible that the measurement and determination of the process monitor circuit 300 described in the above-described embodiments is replaced with any test item for determining, e.g., a circuit velocity serving as a base of function of the semiconductor device. Therefore, the measurement and determination are implemented subsequently to a contact test (conduction check) after the wafer manufacturing process. In the case of any defect (NG), any test thereafter is not carried out.

In the prior art, only using an expensive external device at the later stage of test process of the semiconductor device carries out function test. On the other hand, in this embodiment, the function test can be simply carried out at the early stage of the test process. As a result, cost for the test step of the semiconductor device can be reduced.

Embodiment 12

In this embodiment, an output value of the process monitor circuit is used in diagnosis of a semiconductor manufacturing line or a semiconductor-manufacturing factory. In such diagnosis case, circuit specification and measurement method (oscillation time, voltage, temperature, etc.) are to be constant.

In the measurement of the process monitor circuit according to this embodiment, any difference: (1) in semiconductor wafer surface (between semiconductor chips); (2) between semiconductor wafers; (3) between semiconductor lots; (4) between manufacturing lines; (5) between factories or the like, is monitored.

Figure 26:
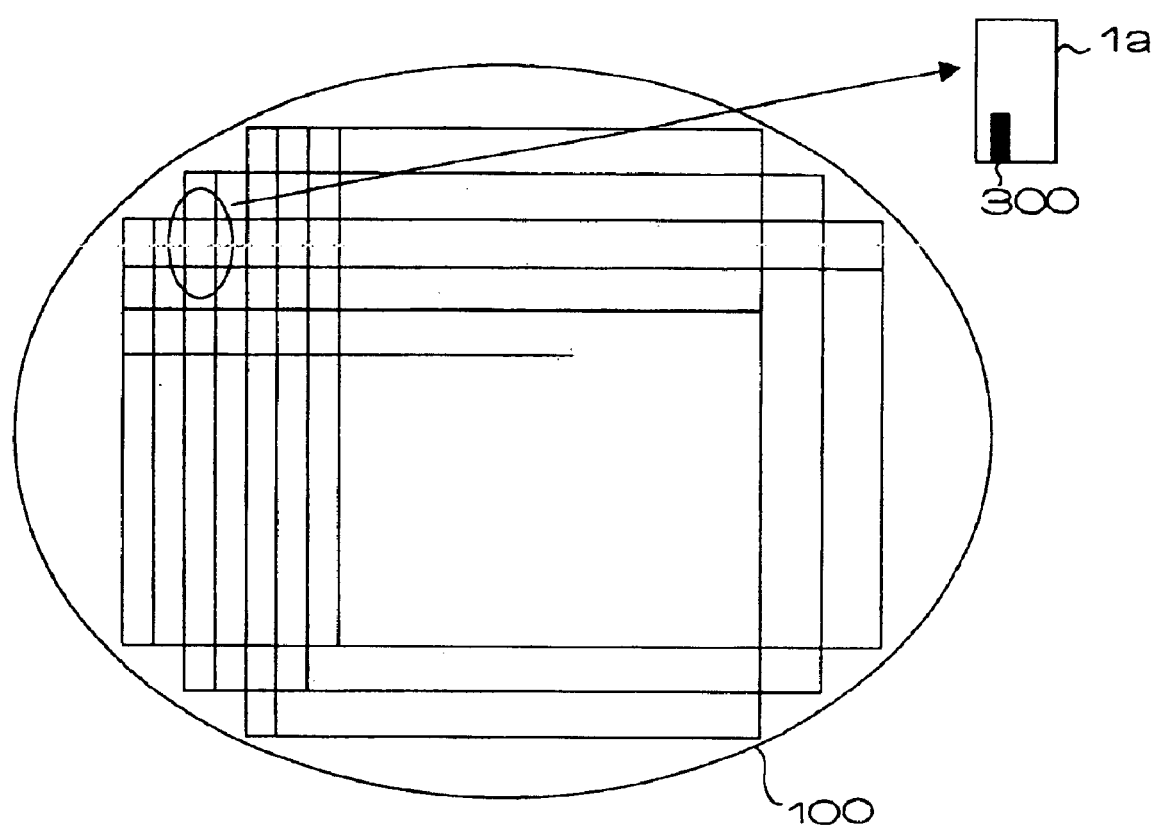
FIG. 26 is a schematic view showing an internal arrangement of semiconductor chip of a process monitor circuit according to Embodiment 12.
Figure 27:
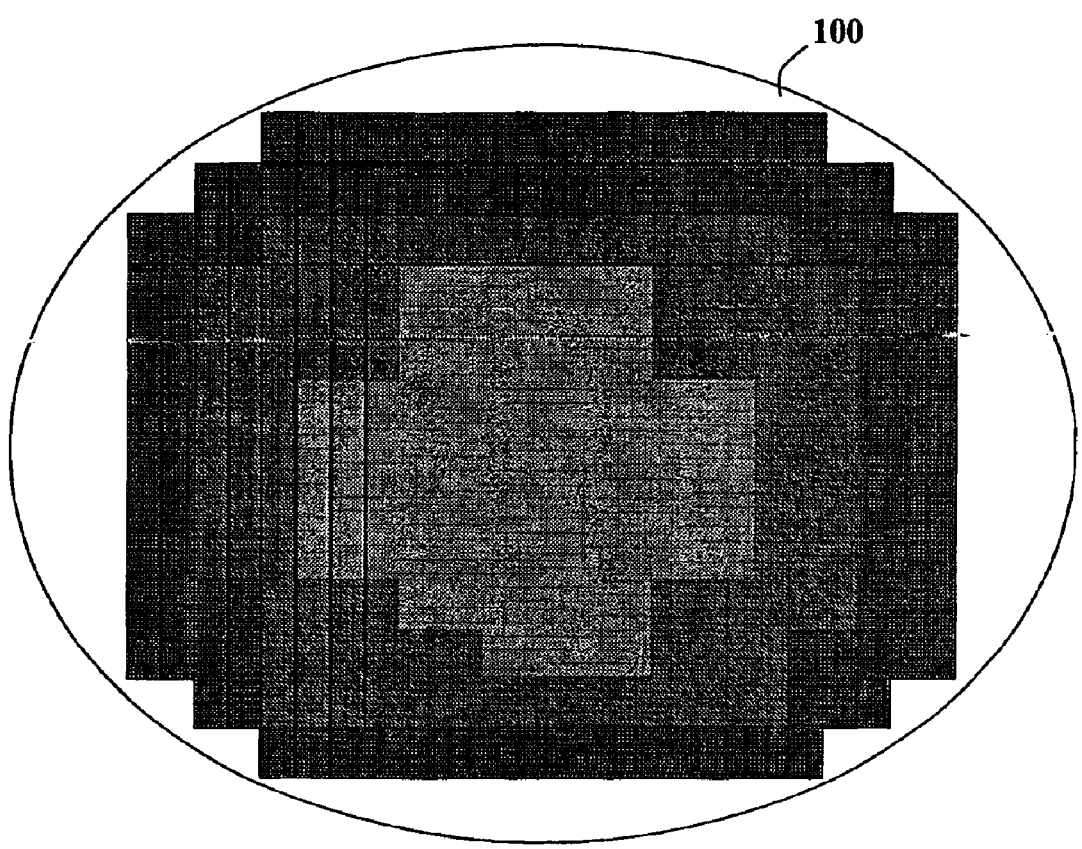
FIG. 27 is a view showing a monitor circuit velocity distribution on a surface of a semiconductor wafer according to Embodiment 12.

The process monitor circuit 300 described in the above-described embodiments is disposed in the internal part of a semiconductor chip 1a or in the proximity of the semiconductor chip 1a to conduct a measurement by the process monitor, as shown in FIG. 26. Thus, as shown in FIG. 27, monitor circuit velocity distribution within the surface of the semiconductor wafer 100 can be detected. Light and shade of color in FIG. 27 is an example of color-coding the chip disposition in accordance with the result of measurement by the process monitor circuit. Thus, a tendency in the manufacturing process can be known.

In addition, a reference value is set, and the result of measurement is compared with this reference value, which can be used as a tool for a regular manufacturing line diagnosis or a factory diagnosis such as wafer foundry.

Further, the result of measurement can be utilized for early detection of abnormality in the manufacturing line or manufacturing factory.

Furthermore, it can be used not only in wafer level but also in evaluation after the assembly of semiconductor chip including dicing and bonding.

As a result, in the semiconductor device according to claims 1, in the manufacturing process of the semiconductor device, even when any characteristic of the circuit element fluctuates exceeding a value estimated at the designing stage, operation timing of the circuit element affected by the fluctuation in process can be appropriately controlled. Accordingly, it becomes possible to prevent operation margin of the circuit element from being reduced thereby improving a degree of freedom in designing.

As a result, in the semiconductor device according to claims 2, since the monitor signal for appropriately controlling the operation timing for the circuit element is held on a permanent basis in the storage circuit, the fluctuation in process is debugged at each chip to secure the appropriate operation margin at all times. In this manner, production of defective product can be restrained, and yield rate will be improved.

As a result, in the semiconductor device according to claims 3, since the process monitor circuit comprises the oscillation circuit constituted of, for example, inverters, etc., it becomes possible to presume a degree of characteristic of the circuit element such as inverter comprised of transistors, being an essential circuit element of the semiconductor device. In this manner, it will be easy to execute an appropriate timing control with respect to the circuit element.

As a result, in the semiconductor device according to claims 4, since the frequency difference can be calculated by switching oscillation frequency of the oscillation circuit, the process fluctuation in the element characteristic due to the process variation can be monitored more accurately than in the case of the arrangement according to claim 3. Accordingly, a predetermined circuit element can be minutely controlled so as to perform at optimum operation timing at all times. In this manner, the operation margin will be further improved.

As a result, in the semiconductor device according to claims 5, the process monitor circuit that monitors fluctuation in the process can be controlled without any special and dedicated external apparatus. Further, the fluctuation in the manufacturing process can be debugged.

As a result, in the semiconductor device according to claims 6, an appropriate type of signal delay circuits can be selected and used in accordance with type or characteristic of the circuit element that requires any timing control.

As a result, in the semiconductor device according to claims 7, without any special and dedicated external device, fluctuation in the manufacturing process of the semiconductor device can be monitored using a simple general-purpose semiconductor test apparatus. In particular, simple control on a command base by means of the control section becomes possible, and the measurement will be simple. Further, development time and development cost of any program, etc. for the purpose of measurement is reduced. In addition, a large number of control terminals are not required, thereby any expensive overhead charge on the product applied with the semiconductor device is not required.

As a result, in the semiconductor device according to claims 8, without any special and dedicated external device, a delay time of psec order can be measured in a short time as well as at a high accuracy using a simple and general-purpose semiconductor test apparatus.

As a result, in the semiconductor device according to claims 9, just by monitoring any circuit part intended to be monitored such as delay circuit used in compensating a timing of the circuit including resistance or capacitor, correlation between the timing compensating delay circuit in circuit simulation and an actually finished device can be observed.

As a result, in the semiconductor device according to claims 10, an advantage is obtained such that it becomes possible to inspect whether or not the process monitor circuit is correctly designed and/or manufactured.

As a result, in the semiconductor device according to claims 11, an advantage is obtained such that the whole process monitor control is standardized, extensive application of inspection and measurement program becomes possible, and development of object to be measured such as plural types of semiconductor devices becomes easy.

As a result, in the test method according to claim 12 and 13, without any special and dedicated external device, a delay time of psec order can be measured in a short time as well as at a high accuracy using a simple and general-purpose semiconductor test apparatus.

As a result, in the test method according to claim 14, just by monitoring any circuit part intended to be monitored such as delay circuit used in compensating a timing of the circuit including resistance or capacitor, correlation between the timing compensating delay circuit in circuit simulation and an actually finished device can be observed. Consequently, accuracy in simulation and yield rate of the product can be improved.

As a result, in the test method according to claim 15, a highly reliable process monitoring can be performed.

As a result, in the test method according to claim 16, any abnormality can be detected at each stage of the manufacturing process, and any cause for the abnormality can be made clear early.

As a result, in the test method according to claim 17, any abnormality can be detected at each stage of the manufacturing process, and any cause for the abnormality can be made clear early.

As a result, in the test method according to claim 18, cost for the test step of the semiconductor device can be reduced.

As a result, in the test method according to claim 19, an advantage is obtained such that a tendency of the manufacturing process between the semiconductor chips or the semiconductor wafers easily becomes clear. Further, any abnormality in the semiconductor manufacturing apparatus, semiconductor-manufacturing line or semiconductor manufacture factory can be early detected.

What is claimed is:

1. A semiconductor device with a process monitor circuit comprising circuit blocks mounted on a common chip with the process monitor circuit to perform required functions, said process monitor circuit being configured for monitoring fluctuation in characteristic of circuit elements of said circuit blocks due to variations in process conditions, and for outputting a monitor signal representing a result of monitoring;

wherein a timing control circuit that controls timing of an input signal supplied to a predetermined circuit element in said circuit blocks, based on said monitor signal from said process monitor circuit, is provided in said circuit blocks.

2. The semiconductor device according to claim 1, wherein a storage circuit that stores the monitor signal outputted from the process monitor circuit on a permanent basis, is further mounted.

3. The semiconductor device according to claim 1, wherein said process monitor circuit comprises:

an oscillation circuit that oscillates at a predetermined frequency; a frequency counter that measures an oscillation frequency of said oscillation circuit; and a comparator circuit that compares the oscillation frequency measured at said frequency counter with a preliminarily set reference value.

4. The semiconductor device according to claims 1, wherein said process monitor circuit comprises:

an oscillation circuit that oscillates at mutually different frequencies respectively in response to a selection signal given from outside; a frequency counter that measures respective oscillation frequencies of said oscillation circuit; and a comparator circuit that calculates a difference between respective oscillation frequencies measured at said frequency counter, and compares the frequency difference with a preliminarily set reference value.

5. The semiconductor device according to claim 1, wherein said process monitor circuit comprises a control section that controls operation of said process monitor circuit.

6. The semiconductor device according to claims 1, in which said timing control circuit comprises a signal delay circuit that gives a delay amount in response to said monitor signal to the input signal inputted to said circuit element.

7. A semiconductor device defined comprising a process monitor circuit that monitors fluctuation in process and outputs a result of monitoring to outside, said process monitor circuit being comprised of:

an oscillation circuit that oscillates at a predetermined frequency; a frequency counter that measures oscillation frequency of said oscillation circuit; and a control section that controls operation of said process monitor circuit based on an external control signal; wherein a counting value of said frequency counter is outputted to the outside of the process monitor circuit, wherein an interface at said process monitor circuit is in compliance with JTAG.

8. A semiconductor device comprising a process monitor circuit that monitors fluctuation in process and outputs a result of monitoring to outside, said process monitor circuit being comprised of:

an oscillation circuit that osculates at mutually different frequencies respectively in response to a selection signal supplied from the outside; a frequency counter that measures respective oscillation frequencies of said oscillation circuit; and a control section that controls operation of said process monitor circuit based on an external control signal;

wherein respective counting values of said frequency counter is outputted to outside.

9. The semiconductor device according to claim 8, wherein a predetermined circuit part intended to be monitored is disposed on one of feedback sides of said oscillation circuit.

10. The semiconductor device according to claim 8, wherein said process monitor circuit comprises a self-diagnosis circuit for diagnosing said process monitor circuit itself.

11. A test method for the semiconductor device provided with a process monitor circuit that monitors fluctuation in process and outputs a result of monitoring to outside;

said process monitor circuit comprising: an oscillation circuit that oscillates at a predetermined frequency; a frequency counter that measures oscillation frequency of said oscillation circuit; and a control section that controls operation of said process monitor circuit based on an external control signal; thus outputting a count value of said frequency counter to the outside of the process monitor circuit;

the test method comprising the steps of:

monitoring the counting value outputted from said frequency counter, collecting the counting value outputted from said frequency counter for each of semiconductor chip, semiconductor wafer, semiconductor device lot, semiconductor manufacturing device, semiconductor manufacturing line, or semiconductor manufacturing factory, and monitoring a difference therebetween.

12. A test method for the semiconductor device provided with a process monitor circuit that monitors fluctuation in process and outputs a result of monitoring to outside, said process monitor circuit comprising: an oscillation circuit that oscillates at mutually different frequencies respectively in response to a selection signal supplied from outside; a frequency counter that measures respective oscillation frequencies of said oscillation circuit; and a control section that controls operation of the process monitor circuit based on an external control signal; thus outputting respective counting values of said frequency counter to outside;

the test method comprising a step of taking a difference between respective counting values outputted from said frequency counter.

13. The test method of a semiconductor device according to claim 12, in which a predetermined circuit part intended to be monitored is disposed on one of feedback sides of said oscillation circuit, the test method comprising a step of taking a difference in counted values between the oscillation circuit on one side that includes the predetermined circuit part intended to be monitored and the oscillation circuit on the other side that does not include the predetermined circuit part intended to be monitored.

14. The test method of a semiconductor device according to claim 12, in which said process monitor circuit further including a circuit that conducts a self-diagnosis for diagnosing said process monitor circuit itself, the test method comprising a step of performing a self-diagnosis for diagnosing said process monitor circuit before a step of monitoring fluctuation in process by means of said process monitor circuit.

15. The test method of a semiconductor device according to claim 12, comprising a step of carrying out monitoring of fluctuation in process by means of said process monitor circuit plural times during semiconductor manufacturing process.

16. The test method of a semiconductor device according to claim 15, wherein determination is performed after the step of monitoring fluctuation in process by means of said process monitor circuit.

17. The test method of a semiconductor device according to claim 12, comprising a step of carrying out monitoring of fluctuation in process by means of said process monitor circuit at a product evaluation stage of the semiconductor device.

* * * * *